(12) United States Patent
Onishi et al.

(10) Patent No.: US 7,660,643 B2
(45) Date of Patent: Feb. 9, 2010

(54) SOLDER MATERIAL TEST APPARATUS, AND METHOD OF CONTROLLING THE SAME

(75) Inventors: Yasuhiro Onishi, Kyoto (JP); Masanobu Horino, Kyoto (JP); Katsumi Ohashi, Kyoto (JP)

(73) Assignee: Omron Corporation, Kyoto-Shi (JP)

( * ) Notice: Subject to any disclaimer, the term of this patent is extended or adjusted under 35 U.S.C. 154(b) by 493 days.

(21) Appl. No.: 11/501,240

(22) Filed: Aug. 9, 2006

(65) Prior Publication Data

US 2007/0046283 A1    Mar. 1, 2007

(30) Foreign Application Priority Data

Aug. 25, 2005    (JP) .............................. 2005-245062

(51) Int. Cl.
   *G06F 19/00*    (2006.01)
(52) U.S. Cl. .................. 700/110; 700/306; 702/183
(58) Field of Classification Search .................. 700/108, 700/213, 250, 117, 299, 300, 306, 110; 702/179, 702/182–183; 250/341.1
   See application file for complete search history.

(56) References Cited

U.S. PATENT DOCUMENTS 5,476,207 A * 12/1995 Peterson et al. ............. 228/102

2003/0230718 A1 * 12/2003 Shelley et al. ............. 250/341.8
2004/0182573 A1 * 9/2004 Gunawardana et al. 166/250.01

* cited by examiner

*Primary Examiner*—Kidest Bahta
*Assistant Examiner*—Nathan Laughlin
(74) *Attorney, Agent, or Firm*—Foley & Lardner LLP

(57) ABSTRACT

A solder material test apparatus includes a control unit and a storage unit which stores master data in advance in which a printing process time when a printing process is performed by using a test-sample solder material is associated with deterioration degree data of the test-sample solder material at the printing process time. The control unit includes a deterioration degree data acquiring unit which acquires deterioration degree data for indicating a deterioration degree of a test-sample solder material, a reading unit which reads a printing process time associated with deterioration degree data set as a limit value with reference to master data and reads a printing process time associated with the deterioration degree data acquired by the deterioration degree data acquiring unit, an operating unit which operates an available remaining time that indicates difference between the printing process times, and a display control unit which informs the available remaining time to a user.

14 Claims, 8 Drawing Sheets

[ Fig 1 ]
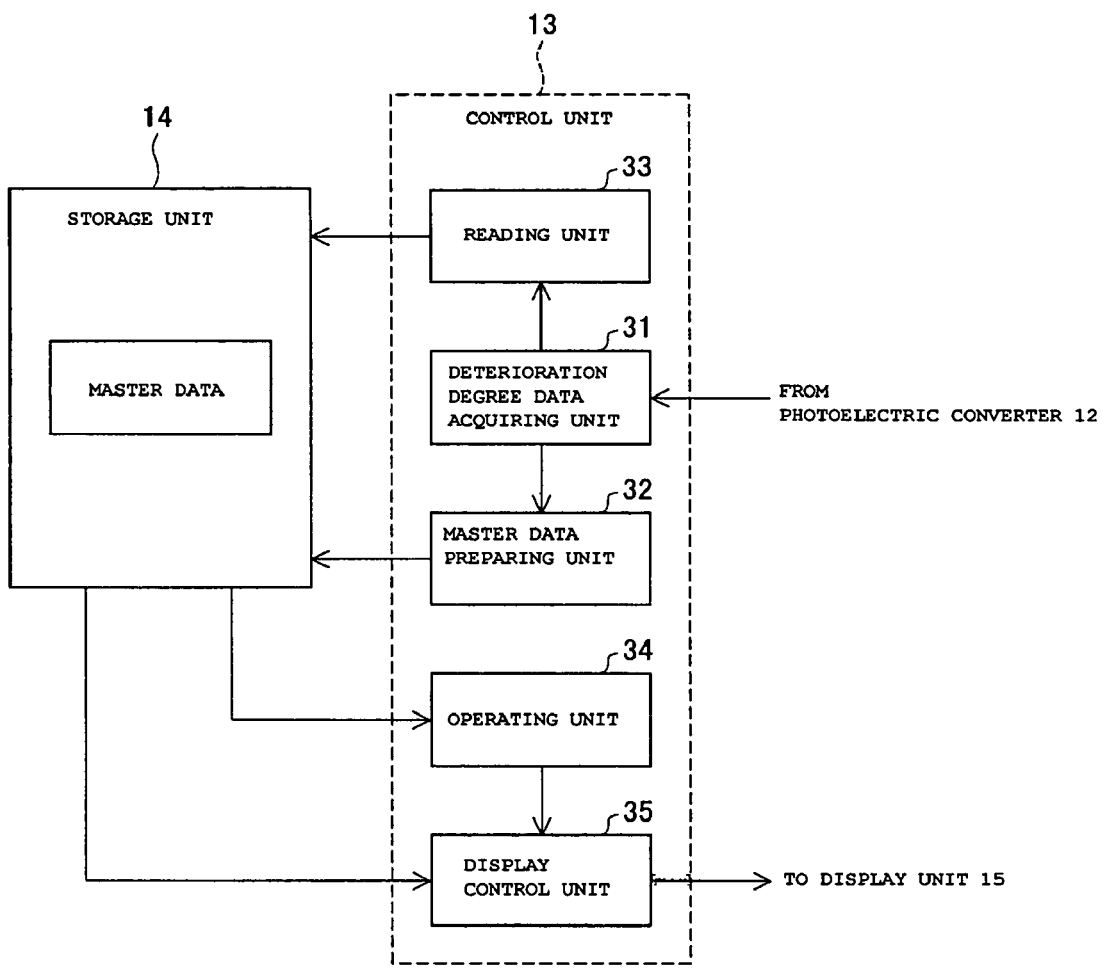

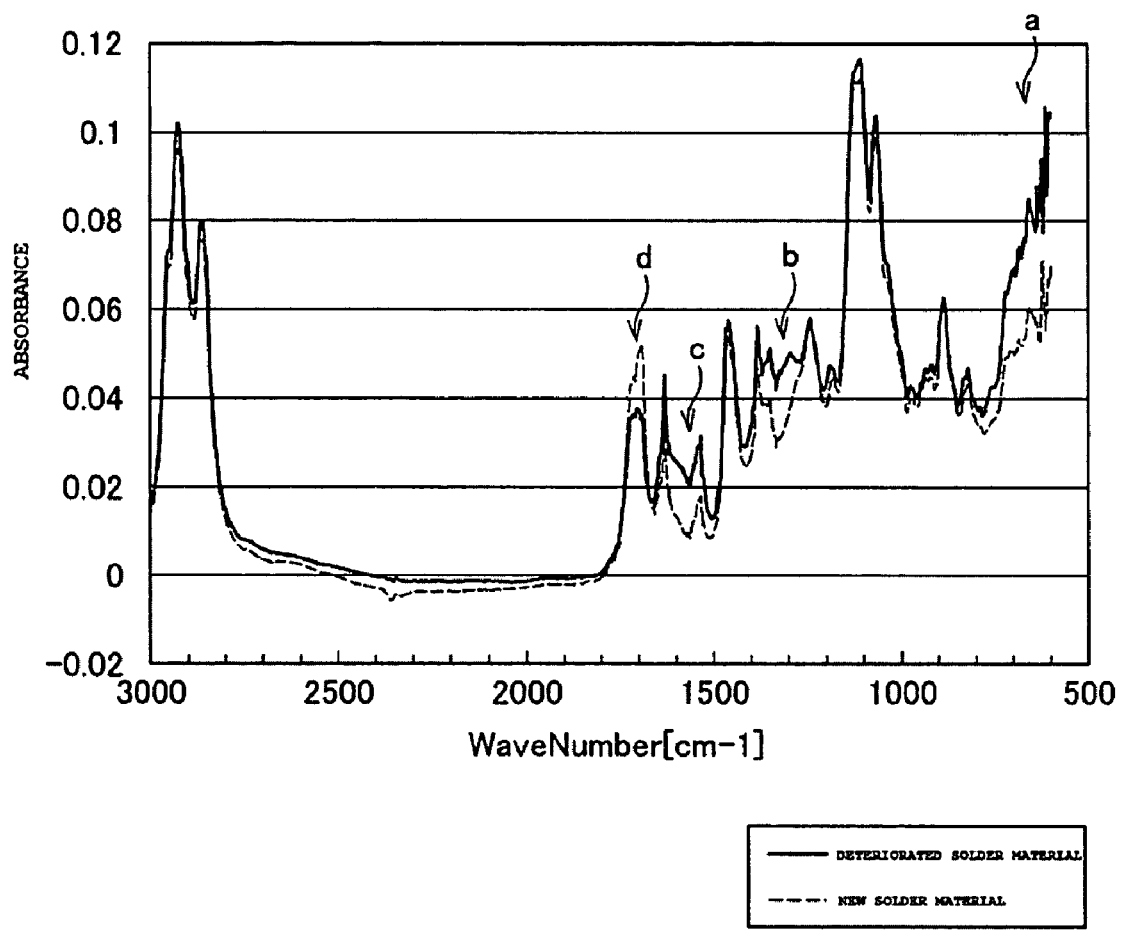
[Fig 2]

[ Fig 3 ]
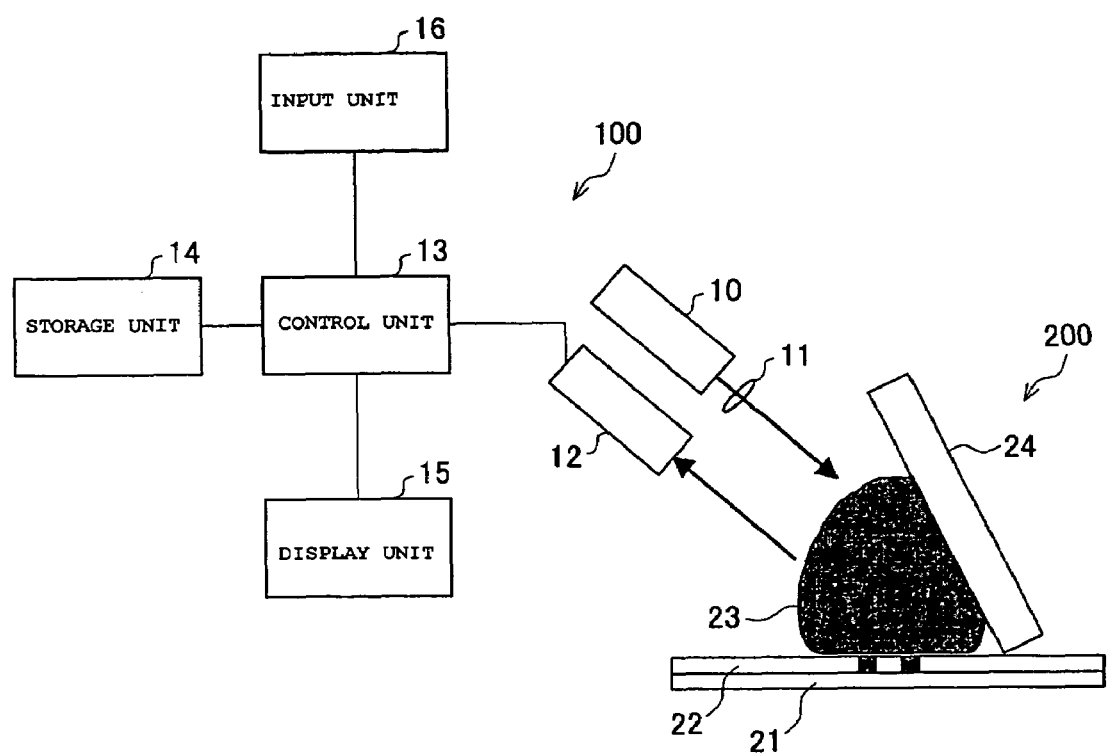

[ Fig 4 ]
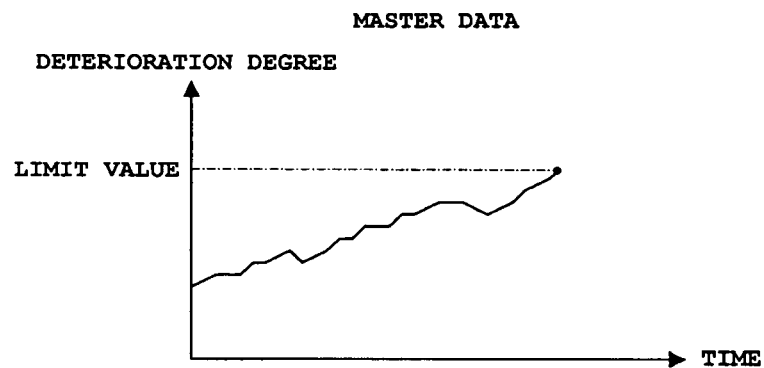
[ Fig 5 ]
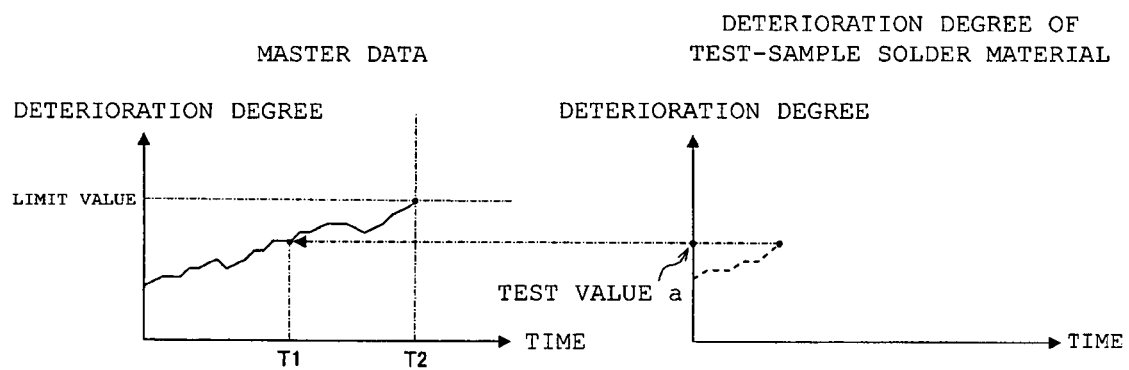

[ Fig 6 ]
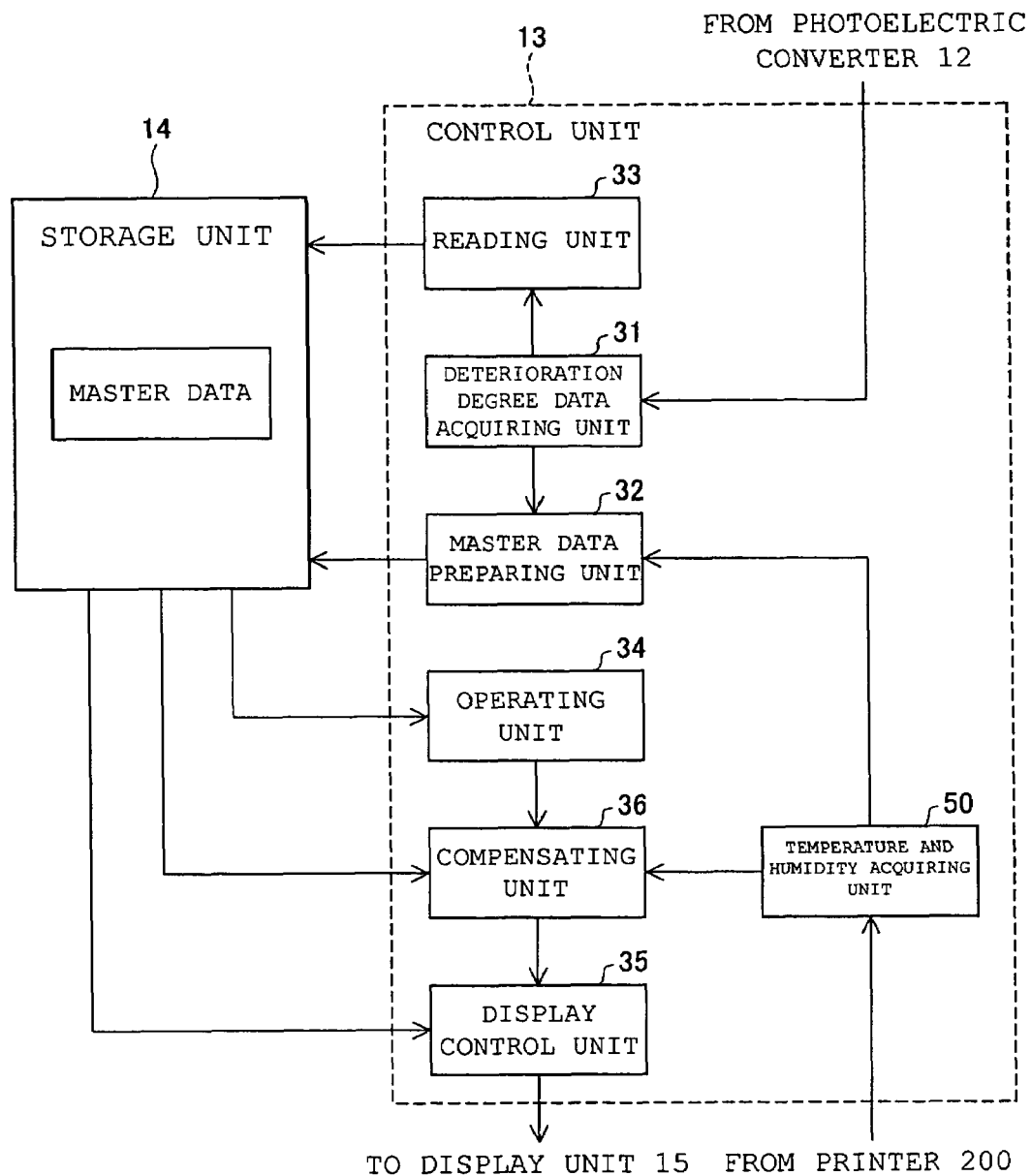

[ Fig 7 ]
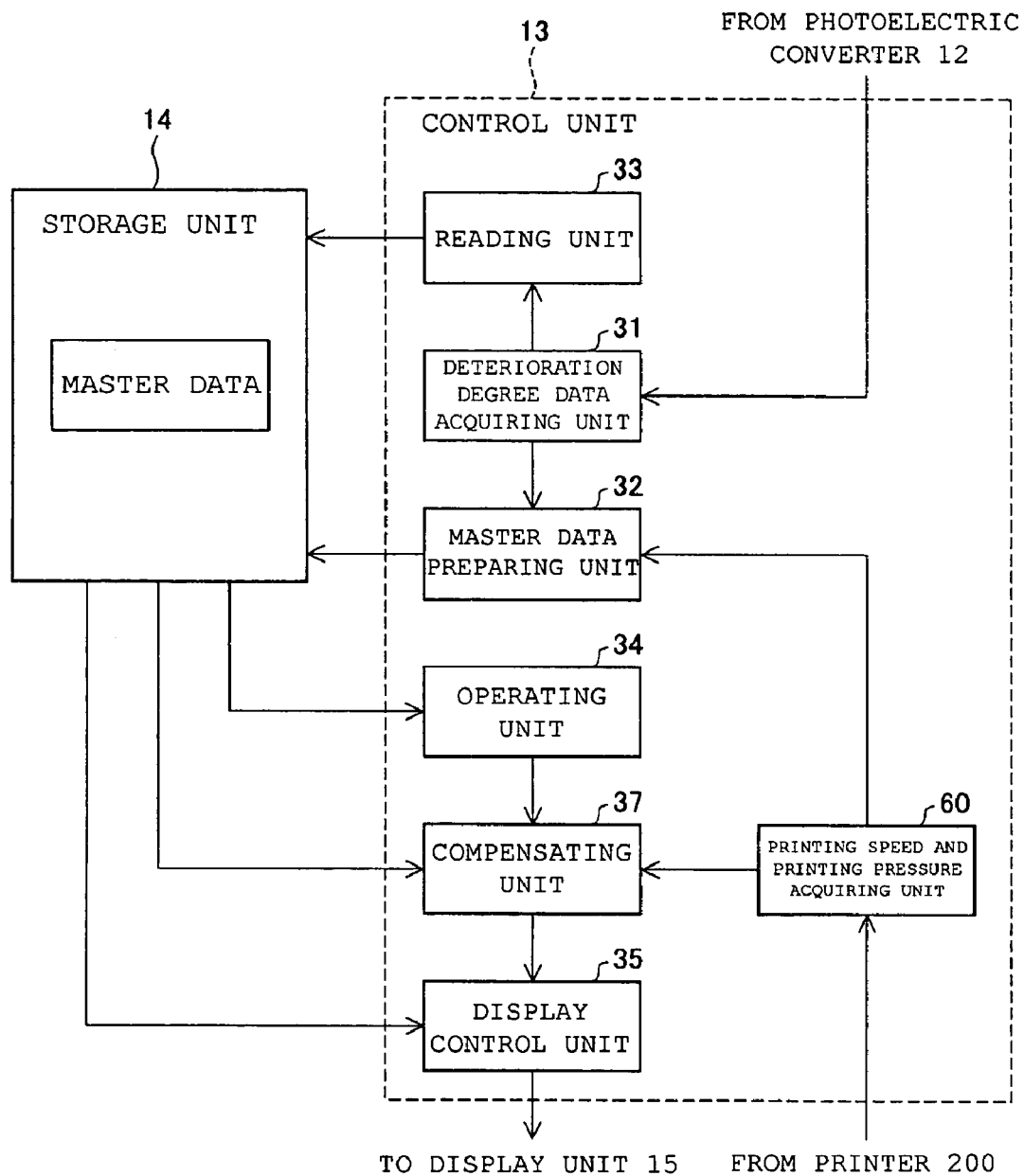

[ Fig 8 ]
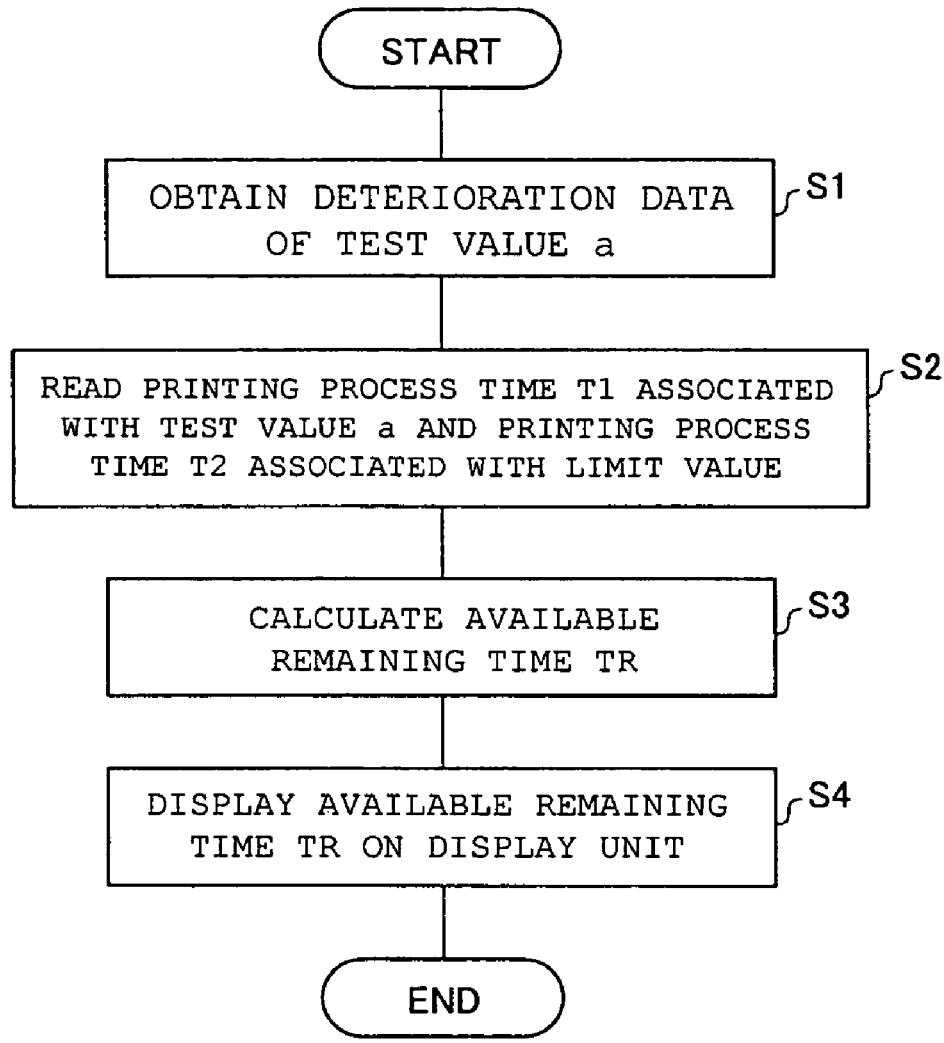

[ Fig 9 ]
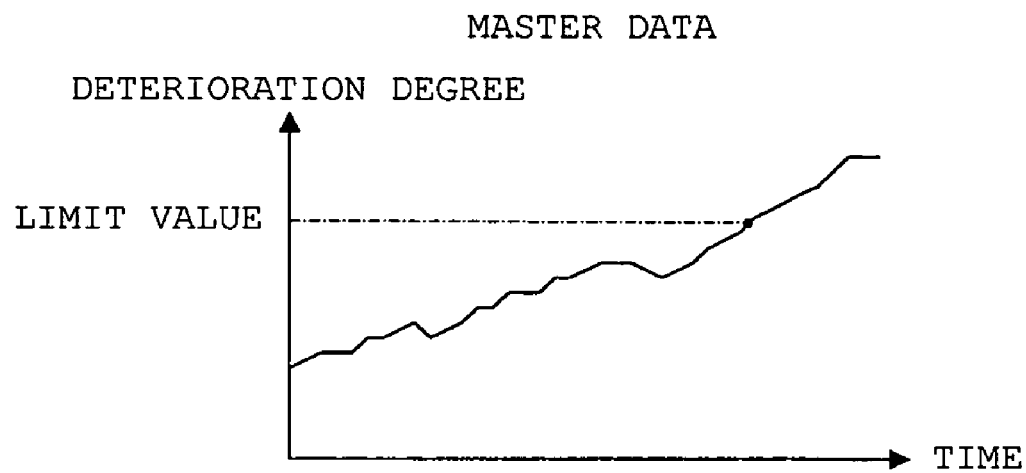
[ Fig 10 ]
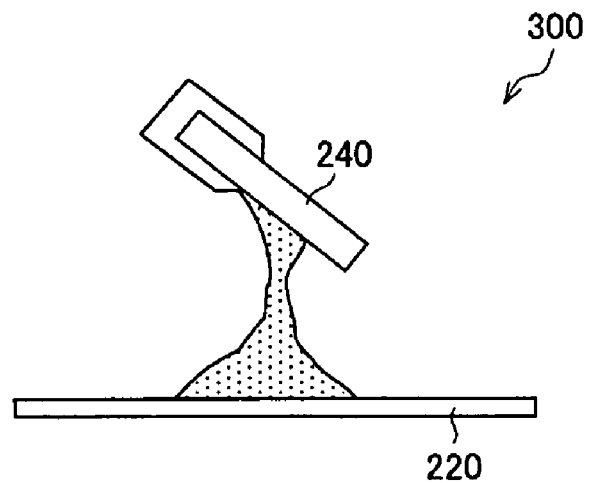

SOLDER MATERIAL TEST APPARATUS, AND METHOD OF CONTROLLING THE SAME

This application claims priority from Japanese patent application 2005-245062, filed on Aug. 25, 2005. The entire content of the aforementioned application is incorporated herein by reference.

BACKGROUND OF THE INVENTION

1. Field of the Invention

The present invention relates to a solder material test apparatus which tests a solder material used on a production line in a factory, a method of controlling the same, a solder material test program, and computer-readable recording medium storing the solder material test program.

2. Description of the Related Art

On the production line of printed boards, electronic components are mounted on the board by performing a printing process of printing a solder material on a board, a mounting process of mounting an electronic component on the printed solder material and a reflow process of fixing the electronic component on the board by soldering.

In the above-mentioned printing process, the solder material is put on the surface of a metal mask placed on the board. The metal mask is formed with an opening corresponding to a wiring pattern. The solder material on the metal mask surface is pushed and rotationally moved by a movable squeegee. Furthermore, the solder material being rotationally moved is squeezed out of the opening onto the board by the pressing force of the movable squeegee. Due to this, the solder material is printed to the board (see paragraph [0011] in JP-A-5-99831).

The metal mask is in continuous use for a number of boards, in a state the same one of solder material is rested thereon. Accordingly, the solder material is rotationally moved by the movable squeegee repeatedly each time printing is performed. Although the solder material gradually deteriorates due to rotational movement, the deteriorated solder material is to constitute a factor causing defects on the printed board.

For this reason, deterioration degree of the solder material on the metal mask should be analyzed in-line so as to determine whether or not the deterioration degree of the solder material exceeds an application limit (value considered that durability of the solder material reaches a limit). If the deterioration degree of the solder material exceeds the application limit, it is important to replace the solder material lying on the metal mask. In addition, before supplying a solder material onto the metal mask, it is important to analyze the deterioration degree of the solder material to be supplied and check whether or not the deterioration degree exceeds the application limit before supplying the solder material.

Here, the solder material has a viscosity, oxidation degree, and reducing power that serve as indexes in evaluating the deterioration degree thereof. The reason of the viscosity, oxidation degree and reducing power is an index is because of the following.

It is known that, as solder material deteriorates, its viscosity increases to proceed to oxidation and lower the reducing power. Herein, it is also known that, when a solder material highly viscous is printed on the board, such defects as 'breakages' or 'blurs' are ready to occur on the board thus printed. Meanwhile, it is also known that, in case an oxidized solder material is printed to the board, such inferiorities as 'solder balls' or 'solder unfused' are ready to occur on the post-reflow board. Furthermore, it is also known that, the solder material lowered in reducing power is printed to a board, such inferiority as 'wettability reduction' readily occurs on the post-reflow board.

Namely, the viscosity, oxidation degree and reducing power of a solder material are correlated to the occurrence rate of printed board inferiorities. For this reason, the viscosity, oxidation degree and reducing power of a solder material serves as a significant index in evaluating the deterioration degree of a solder material. Accordingly, it is possible to analyze the deterioration degree of the solder material by measuring at least one of the viscosity, oxidation degree, and reducing power of a solder material.

Conventionally, there are various methods to analyze the deterioration degree of solder material, as exemplified in JP-A-5-99831 (date opened: Apr. 23, 1993), JP-B-8-20434 (date published: Mar. 4, 1996) and JP-A-10-82737 (date opened: Mar. 31, 1998).

JP-A-5-99831 discloses a method to measure the viscosity of a solder material depending upon a velocity of a solder material flowing on a squeegee surface. JP-B-8-20434 discloses a method of measuring the acid degree of a solder material (oxidation degree and reducing power of the solder material) by conducting a titration by use of a solder material sampled. JP-A-10-82737 discloses a technique of measuring the surface oxidation rate (oxidation degree and reducing power of the surface of the solder material) of a solder material according to the ultraviolet-ray photoelectron spectroscopy.

Therefore, it is possible to analyze the deterioration degree of the solder material by using the viscosity, oxidation degree, and reducing power of a solder material measured by using the above-mentioned methods as deterioration data which indicates the deterioration degree of the solder material.

However, in the above-mentioned methods according to JP-A-5-99831, JP-B-8-20434, and JP-A-10-82737, the deterioration degree data of the solder material used in the printing process should be frequently measured and checked whether or not the deterioration degree data of the solder material exceeds the application limit (desired value). If the deterioration degree data of the solder material exceeds the application limit, the solder material should be changed in a prompt manner thereby taking a lot of labor and time.

At the same time, if it is possible to estimate a print time or the number of printing processes required until the deterioration degree data of the solder material used in the printing process exceeds the application limit (desired value), the deterioration degree does not need to be frequently measured such that the labor and time of a user who controls a production can be reduced.

SUMMARY OF THE INVENTION

Accordingly, it is an object of the present invention to provide a solder material test apparatus, a method of controlling the same, a solder material test program, and computer-readable recording medium storing the solder material test program so as to reduce labor and time requested to a user.

According to an aspect of the invention, a solder material test apparatus which tests a solder material used in a printer that prints the solder material on a printer board, includes: a deterioration degree data acquiring unit which acquires deterioration degree data that indicates a deterioration degree of a first solder material; a storage unit which stores association data in advance in which a printing process time when a printing process is performed by using a second solder material in a printer is associated with deterioration degree data of the second solder material at the printing process time; a reading unit which reads a printing process time associated with deterioration degree data set as a desired value with reference to the association data and reads a printing process time associated with the deterioration degree data acquired by the deterioration degree data acquiring unit; an information creating unit which creates information that indicates a time required until the deterioration degree data of the first solder material reaches the desired value or a time when the deterioration degree data of the first solder material reaches the desired value in the case of performing the printing process by using the first solder material in the printer on the basis of both the printing process times read by the reading unit; and an informing unit which notifies the information to a user.

According to another aspect of the invention, a method of controlling a solder material test apparatus which tests a solder material used in a printer that prints the solder material on a printer board, the solder material test apparatus including a control unit and a storage unit which stores association data in advance in which a printing process time when a printing process is performed by using a second solder material in a printer is associated with deterioration degree data of the second solder material at the printing process time, the method including, by means of the control unit: acquiring deterioration degree data that indicates a deterioration degree of a first solder material; reading a printing process time associated with deterioration degree data set as a desired value with reference to the association data and reads a printing process time associated with the deterioration degree data acquired in the deterioration degree data acquiring unit; creating information that indicates a time required until the deterioration degree data of the first solder material reaches the desired value or a time when the deterioration degree data of the first solder material reaches the desired value in the case of performing the printing process by using the first solder material in the printer on the basis of both the printing process times read by the reading unit; and notifying the information to a user.

The solder material used in the printer easily deteriorates whenever the printer repeatedly performs the printing process. Here, in the above-described construction, the reading unit reads a printing process time of the second solder material so as to indicate the deterioration degree data set as the desired value and a printing process time of the second solder material so as to indicate the deterioration degree data which is the same as the deterioration degree data of the first solder material. When it is assumed that the printer starts the printing process by using the second solder material having the same deterioration degree data with the first solder material, the difference between both the read printing process times corresponds to a printing process time required until the deterioration degree data of the second solder material reaches the desired value. Accordingly, when the printer starts the printing process by using the first solder material, it can be assumed that the difference between both the read printing process times is the printing process time required until the deterioration degree data of the first solder material reaches the desired value.

On the basis of both the printing process times read by the reading unit, it is possible to create information which indicates a time required until the deterioration degree data of the first solder material reaches the desired value when the printer performs the printing process in the printer by using the first solder material or a time when the deterioration degree data of the first solder material reaches the desired value. The information may be the difference between both the printing process times, or the time when the current time is added to the difference between both the printing process times. In addition, the read both printing process times may be also used as the information. Even when both the printing process times are informed to the user, if the user knows both the printing process times, the user can recognize the difference between both the printing process times and the time in which current time is added to the difference between both the printing process times.

When the first solder material is used in the printer, the user who receives the information can estimate the timing in which the deterioration degree data of the first solder material reaches the desired value beforehand. Accordingly, it is possible to effectively reduce the time and labor of the user than the related art which is necessary to frequently measure the deterioration degree of the solder material in order to grasp the timing.

In addition, according to the above-described construction, when the first solder material is used in the printer, it is possible to estimate the timing in which the deterioration degree data of the first solder material reaches the desired value without using a keeping time and a usage history of the first solder material. Accordingly, it is possible to omit the time and labor for recording the keeping time and the usage history.

In addition, in the solder material test apparatus according to the invention, it is preferable that the information creating unit create time difference as the information which indicates difference between the printing process times read by the reading unit.

In the above-described construction, when the printer starts the printing process by using the second solder material having the same deterioration degree data as the first solder material, the time difference informed to the user corresponds to the printing process time required until the deterioration degree data of the second solder material reaches the desired value. Accordingly, when the printer starts the printing process by using the first solder material, it can be assumed that the time difference is the printing process time required until the deterioration degree data of the first solder material reaches the desired value.

Therefore, when the first solder material is used in the printer, the user can estimate the timing in which the deterioration degree data of the first solder material reaches the desired value beforehand. Accordingly, it is possible to effectively reduce the time and labor of the user than the related art which is necessary to frequently measure the deterioration degree of the solder material in order to grasp the timing.

Further, a deterioration speed of the solder material used in the printer is in a direct proportion to the temperature around the printer. It may be assumed that the temperature around the printer at the current moment is higher than the temperature around the printer when the deterioration degree data included in the association data is measured. If the printing process is performed by using the first solder material at the current moment, the printing process time required until the deterioration degree data of the first solder material reaches the desired value becomes shorter than the time difference. It may be assumed that the temperature around the printer at the current moment is lower than the temperature around the printer when the deterioration degree data included in the association data is measured. If the printing process is performed by using the first solder material at the current moment, the printing process time required until the deterioration degree data of the first solder material reaches the desired value becomes longer than the time difference.

Here, the solder material test apparatus according to the invention preferably further includes a first compensating unit and a temperature acquiring unit which acquires temperature around the printer. In the association data, the temperature at the moment when the deterioration degree data included in the corresponding association data is measured is associated and recorded. The first compensating unit compensates for the time difference created by the information creating unit to be small when the temperature acquired by the temperature acquiring unit is higher than the temperature recorded in the association data and compensates for the time difference created by the information creating unit to be large when the temperature acquired by the temperature acquiring unit is lower than the temperature recorded in the association data. Accordingly, the calculated time difference can be close to the printing process time required until the deterioration degree data of the first solder material reaches the desired value.

Further, a deterioration speed of the solder material used in the printer is in a direct proportion to the humidity around the printer. It may be assumed that the humidity around the printer at the current moment is higher than the humidity around the printer when the deterioration degree data included in the association data is measured. If the printing process is performed by using the first solder material at the current moment, the printing process time required until the deterioration degree data of the first solder material reaches the desired value becomes shorter than the time difference. It may be assumed that the humidity around the printer at the current moment is lower than the humidity around the printer when the deterioration degree data included in the association data is measured. If the printing process is performed by using the first solder material at the current moment, the printing process time required until the deterioration degree data of the first solder material reaches the desired value becomes longer than the time difference.

Here, the solder material test apparatus according to the invention preferably further includes a second compensating unit and a humidity acquiring unit which acquires humidity around the printer. In the association data, the humidity at the moment when the deterioration degree data included in the corresponding association data is measured is associated and recorded, and the second compensating unit compensates for the time difference created by the information creating unit to be small when the humidity acquired by the humidity acquiring unit is higher than the humidity recorded in the association data and compensates for the time difference created by the information creating unit to be large when humidity acquired by the humidity acquiring unit is lower than the humidity recorded in the association data. Accordingly, the calculated time difference can be close to the printing process time required until the deterioration degree data of the first solder material reaches the desired value.

Further, a deterioration speed of the solder material used in the printer is in direct proportion to the printing speed of the printer. It may be assumed that the printing speed of the printer at the current moment is higher than the printing speed of the printer when the deterioration degree data included in the association data is measured. If the printing process is performed by using the first solder material at the current moment, the printing process time required until the deterioration degree data of the first solder material reaches the desired value becomes shorter than the time difference. It may be assumed that the printing speed of the printer at the current moment is lower than the printing speed of the printer when the deterioration degree data included in the association data is measured. If the printing process is performed by using the first solder material at the current moment, the printing process time required until the deterioration degree data of the first solder material reaches the desired value becomes longer than the time difference.

Here, the solder material test apparatus according to the invention preferably further includes a third compensating unit and a printing speed acquiring unit which acquires printing speed of the printer. In the association data, the printing speed at the moment when the deterioration degree data included in the corresponding association data is measured is associated and recorded, and the third compensating unit compensates for the time difference created by the information creating unit to be small when the printing speed acquired by the printing speed acquiring unit is higher than the printing speed recorded in the association data and compensates for the time difference created by the information creating unit to be large when the printing speed acquired by the printing speed acquiring unit is lower than the printing speed recorded in the association data.

Accordingly, the calculated time difference can be close to the printing process time required until the deterioration degree data of the first solder material reaches the desired value.

Further, the printing speed in the printer which prints the solder material on the board means a travel speed of the solder material on a mask for print or a travel speed of a squeegee for print which moves the corresponding solder material.

Further, a deterioration speed of the solder material used in the printer is in direct proportion to the printing pressure of the printer. It may be assumed that the printing pressure of the printer at the current moment is higher than the printing pressure of the printer when the deterioration degree data included in the association data is measured. If the printing process is performed by using the first solder material at the current moment, the printing process time required until the deterioration degree data of the first solder material reaches the desired value becomes shorter than the time difference. It may be assumed that the printing pressure of the printer at the current moment is lower than the printing pressure of the printer when the deterioration degree data included in the association data is measured. If the printing process is performed by using the first solder material at the current moment, the printing process time required until the deterioration degree data of the first solder material reaches the desired value becomes longer than the time difference.

Here, the solder material test apparatus according to the invention preferably further includes a fourth compensating unit and a printing pressure acquiring unit which acquires printing pressure of the printer. In the association data, the printing pressure at the moment when the deterioration degree data included in the corresponding association data is measured is associated and recorded, and the fourth compensating unit compensates for the time difference created by the information creating unit to be small when the printing pressure acquired by the printing pressure acquiring unit is higher than the printing pressure recorded in the association data and compensates for the time difference created by the information creating unit to be large when the printing pressure acquired by the printing pressure acquiring unit is lower than the printing pressure recorded in the association data. Accordingly, the calculated time difference can be close to the printing process time required until the deterioration degree data of the first solder material reaches the desired value.

Further, the printing pressure in the printer which prints the solder material on the board means a pressing force of the squeegee for print with respect to the solder material.

According to another aspect of the invention, a solder material test apparatus which tests a solder material used in a printer that prints the solder material on a printer board, including: a deterioration degree data acquiring unit which acquires deterioration degree data that indicates a deterioration degree of a first solder material; a storage unit which stores association data in advance in which the number of printing processes when a printing process is performed by using a second solder material in the printer is associated with deterioration degree data of the second solder material at the number of printing processes; a reading unit which reads the number of printing processes associated with deterioration degree data set as a desired value with reference to the association data and reads the number of printing processes associated with the deterioration degree data acquired by the deterioration degree data acquiring unit; an information creating unit which creates information that indicates the number of printing processes in the printer required until the deterioration degree data of the first solder material reaches the desired value or the number of printing processes from when the printer starts the printing process at the moment when the deterioration degree data of the first solder material reaches the desired value in the case of performing the printing process by using the first solder material in the printer on the basis of the number of printing processes read by the reading unit; and an informing unit which notifies the information to a user.

According to another aspect of the invention, a method of controlling a solder material test apparatus which tests a solder material used in a printer that prints the solder material on a printer board, the solder material test apparatus including a control unit and a storage unit which stores association data in advance in which the number of printing processes when a printing process is performed by using a second solder material in the printer is associated with deterioration degree data of the second solder material at the number of printing processes, the method comprising, by means of the control unit: acquiring deterioration degree data that indicates a deterioration degree of a first solder material; reading the number of printing processes associated with deterioration degree data set as a desired value with reference to the association data and reads the number of printing processes associated with the deterioration degree data acquired by the deterioration degree data acquiring unit; creating information that indicates the number of printing processes in the printer required until the deterioration degree data of the first solder material reaches the desired value or the number of printing processes from when the printer starts the printing process at the moment when the deterioration degree data of the first solder material reaches the desired value in the case of performing the printing process by using the first solder material in the printer on the basis of both the numbers of printing processes read by the reading unit; and notifying the information to a user.

The solder material used in the printer easily deteriorates whenever the printer repeatedly performs the printing process in the printer. Here, in the above-described construction, the reading unit reads the number of printing processes of the second solder material so as to indicate the deterioration degree data set as the desired value and the number of printing processes of the second solder material so as to indicate the deterioration degree data which is the same as the deterioration degree data of the first solder material. When it is assumed that the printer starts the printing process by using the second solder material having the same deterioration degree data with the first solder material, the difference between both the numbers of read printing processes corresponds to the number of printing processes required until the deterioration degree data of the second solder material reaches the desired value. Accordingly, when the printer starts the printing process by using the first solder material, it can be assumed that the difference between both the numbers of read printing processes is the number of printing processes required until the deterioration degree data of the first solder material reaches the desired value.

On the basis of both the numbers of printing processes read by the reading unit, it is possible to create information which indicates the number of printing processes required until the deterioration degree data of the first solder material reaches the desired value when the printer performs the printing process by using the first solder material or the number of printing processes from when the printer starts the printing process at the moment when the deterioration degree data of the first solder material reaches the desired value. The information may be the difference between both numbers of printing processes or the number of printing processes in which the number of printing processes from when the current printer starts the printing process is added to the difference between the numbers of printing processes. In addition, both the read numbers of printing processes may be also used as the information. Even when both the numbers of printing processes are informed to the user, if the user knows both the numbers of printing processes, the user can recognize difference between both the numbers of printing processes and the number of printing processes in which the difference between the numbers of printing processes is added to the number of printing processes from when the current printer starts the printing process.

When the first solder material is used in the printer, the user who receives the information can estimate the timing in which the deterioration degree data of the first solder material reaches the desired value beforehand. Accordingly, it is possible to effectively reduce the time and labor of the user than the related art which is necessary to frequently measure the deterioration degree of the solder material in order to grasp the timing.

In addition, according to the above-described construction, when the first solder material is used in the printer, it is possible to estimate the timing in which the deterioration degree data of the first solder material reaches the desired value without using a keeping time and a usage history of the first solder material. Accordingly, it is possible to omit the time and labor for recording the keeping time and the usage history.

Further, the number of printing processes is a standard which indicates a printing process amount of the printer. For example, the number of printing process means (a) the number of printing processes assumed as one process with respect to one board from when a printing process is started by using the solder material and until printing process is terminated, (b) the number of printing processes assumed as one process with respect to the predetermined number of boards from when a printing process is started by using the solder material and until printing process is terminated, and (c) the number of printing processes assumed as one process with respect to a process for moving the print squeegee as many as predetermined times.

In addition, in the solder material test apparatus of the invention, it is preferable that the information creating unit create number difference as the information which indicates the difference between the numbers of printing processes read by the reading unit.

In the above-described construction, when the printer starts the printing process by using the second solder material having the same deterioration degree data as the first solder material, the number difference informed to the user corresponds to the number of printing processes required until the deterioration degree data of the second solder material reaches the desired value. Accordingly, when the printer starts the printing process by using the first solder material, it can be assumed that the number difference is the number of printing processes required until the deterioration degree data of the first solder material reaches the desired value.

Therefore, when the first solder material is used in the printer, the user can estimate the timing in which the deterioration degree data of the first solder material reaches the desired value beforehand. Accordingly, it is possible to effectively reduce the time and labor of the user than the related art which is necessary to frequently measure the deterioration degree of the solder material in order to grasp the timing.

Further, a deterioration speed of the solder material used in the printer is in a direct proportion to the temperature around the printer. It may be assumed that the temperature around the printer at the current moment is higher than the temperature around the printer when the deterioration degree data included in the association data is measured. If the printing process is performed by using the first solder material at the current moment, the number of printing processes required until the deterioration degree data of the first solder material reaches the desired value becomes smaller than the number difference. It may be assumed that the temperature around the printer at the current moment is lower than the temperature around the printer when the deterioration degree data included in the association data is measured. If the printing process is performed by using the first solder material at the current moment, the number of printing processes required until the deterioration degree data of the first solder material reaches the desired value becomes larger than the number difference.

Here, the solder material test apparatus according to the invention preferably further includes a first compensating unit and a temperature acquiring unit which acquires temperature around the printer. In the association data, the temperature at the moment when the deterioration degree data included in the corresponding association data is measured is associated and recorded, and the first compensating unit compensates for the number difference created by the information creating unit to be small when the temperature acquired by the temperature acquiring unit is higher than the temperature recorded in the association data and compensates for the number difference created by the information creating unit to be large when the temperature acquired by the temperature acquiring unit is lower than the temperature recorded in the association data. Accordingly, the calculated number difference can be close to the number of printing processes required until the deterioration degree data of the first solder material reaches the desired value.

Further, a deterioration speed of the solder material used in the printer is in a direct proportion to the humidity around the printer. It may be assumed that the humidity around the printer at the current moment is higher than the humidity around the printer when the deterioration degree data included in the association data is measured. If the printing process is performed by using the first solder material at the current moment, the number of printing processes required until the deterioration degree data of the first solder material reaches the desired value becomes smaller than the number difference. It may be assumed that the humidity around the printer at the current moment is lower than the humidity around the printer when the deterioration degree data included in the association data is measured. If the printing process is performed by using the first solder material at the current moment, the number of printing processes required until the deterioration degree data of the first solder material reaches the desired value becomes larger than the number difference.

Here, the solder material test apparatus according to the invention preferably further includes a second compensating unit and a humidity acquiring unit which acquires humidity around the printer. In the association data, the humidity at the moment when the deterioration degree data included in the corresponding association data is measured is associated and recorded, and the second compensating unit compensates for the number difference created by the information creating unit to be small when the humidity acquired by the humidity acquiring unit is higher than the humidity recorded in the association data and compensates for the number difference created by the information creating unit to be large when humidity acquired by the humidity acquiring unit is lower than the humidity recorded in the association data. Accordingly, the calculated number difference can be close to the number of printing processes required until the deterioration degree data of the first solder material reaches the desired value.

Further, a deterioration speed of the solder material used in the printer is in direct proportion to the printing speed of the printer. It may be assumed that the printing speed of the printer at the current moment is higher than the printing speed of the printer when the deterioration degree data included in the association data is measured. If the printing process is performed by using the first solder material at the current moment, the number of printing processes required until the deterioration degree data of the first solder material reaches the desired value becomes smaller than the number difference. It may be assumed that the printing speed of the printer at the current moment is lower than the printing speed of the printer when the deterioration degree data included in the association data is measured. If the printing process is performed by using the first solder material at the current moment, the number of printing processes required until the deterioration degree data of the first solder material reaches the desired value becomes larger than the number difference.

Here, the solder material test apparatus according to the invention preferably further includes a third compensating unit and a printing speed acquiring unit which acquires printing speed of the printer. In the association data, the printing speed at the moment when the deterioration degree data included in the corresponding association data is measured is associated and recorded, and the third compensating unit compensates for the number difference created by the information creating unit to be small when the printing speed acquired by the printing speed acquiring unit is higher than the printing speed recorded in the association data and compensates for the number difference created by the information creating unit to be large when the printing speed acquired by the printing speed acquiring unit is lower than the printing speed recorded in the association data.

Accordingly, the calculated number difference can be close to the number of printing processes required until the deterioration degree data of the first solder material reaches a desired value.

Further, a deterioration speed of the solder material used in the printer is in direct proportion to the printing pressure of the printer. It may be assumed that the printing pressure of the printer at the current moment is higher than the printing pressure of the printer when the deterioration degree data included in the association data is measured. If the printing process is performed by using the first solder material at the current moment, the number of printing processes required until the deterioration degree data of the first solder material reaches the desired value becomes smaller than the number difference. It may be assumed that the printing pressure of the printer at the current moment is lower than the printing pressure of the printer when the deterioration degree data included in the association data is measured. If the printing process is performed by using the first solder material at the current moment, the number of printing processes required until the deterioration degree data of the first solder material reaches the desired value becomes larger than the number difference.

Here, the solder material test apparatus according to the invention preferably further includes a fourth compensating unit and a printing pressure acquiring unit which acquires printing pressure of the printer. In the association data, the printing pressure at the moment when the deterioration degree data included in the corresponding association data is measured is associated and recorded, and the fourth compensating unit compensates for the number difference created by the information creating unit to be small when the printing pressure acquired by the printing pressure acquiring unit is higher than the printing pressure recorded in the association data and compensates for the number difference created by the information creating unit to be large when the printing pressure acquired by the printing pressure acquiring unit is lower than the printing pressure recorded in the association data. Accordingly, the calculated number difference can be close to the number of printing processes required until the deterioration degree data of the first solder material reaches the desired value.

Further, each of units of the solder material test apparatus may be implemented by a computer. In this case, a solder material test program causing a computer to function as the units of the solder material test apparatus and a computer-readable recording medium having the solder material test program recorded therein are included in the scope of the invention.

As described above, the solder material test apparatus according to the invention includes a deterioration degree data acquiring unit which acquires deterioration degree data that indicates a deterioration degree of a first solder material; a storage unit which stores association data in advance in which a printing process time when a printing process is performed by using a second solder material in the printer is associated with deterioration degree data of the second solder material at the printing process time; a reading unit which reads a printing process time associated with deterioration degree data set as a desired value with reference to the association data and reads a printing process time associated with the deterioration degree data acquired by the deterioration degree data acquiring unit; an information creating unit which creates information that indicates a time required until the deterioration degree data of the first solder material reaches the desired value or a time when the deterioration degree data of the first solder material reaches the desired value in the case of performing the printing process by using the first solder material in the printer on the basis of both the printing process times read by the reading unit; and an informing unit which notifies the information to a user.

In addition, the solder material test apparatus according to the invention includes a deterioration degree data acquiring unit which acquires deterioration degree data that indicates a deterioration degree of a first solder material; a storage unit which stores association data in advance in which the number of printing processes when a printing process is performed by using a second solder material in the printer is associated with deterioration degree data of the second solder material at the number of printing processes; a reading unit which reads the number of printing processes associated with deterioration degree data set as a desired value with reference to the association data and reads the number of printing processes associated with the deterioration degree data acquired by the deterioration degree data acquiring unit; an information creating unit which creates information that indicates the number of printing processes in the printer required until the deterioration degree data of the first solder material reaches the desired value or the number of printing processes from when the printer starts the printing process at the moment when the deterioration degree data of the first solder material reaches the desired value in the case of performing the printing process by using the first solder material in the printer on the basis of both the numbers of printing processes read by the reading unit; and an informing unit which notifies the information to a user.

Therefore, when the first solder material is used in the printer, the user can estimate timing in which the deterioration degree data of the first solder material reaches the desired value beforehand. Accordingly, it is possible to effectively reduce the time and labor of the user than the related art in which the deterioration degree of the solder material should be frequently measured in order to grasp the timing.

BRIEF DESCRIPTION OF THE DRAWINGS

FIG. 1 is a block diagram illustrating the construction of a control unit included in a solder material test apparatus according to an embodiment of the invention;

FIG. 2 is a spectrum chart illustrating an infrared-ray absorbance to a new solder material and an infrared-ray absorbance to deteriorated solder material;

FIG. 3 is a schematic diagram illustrating a schematic construction of the solder material test apparatus according to the embodiment of the invention;

FIG. 4 is a graph illustrating an example of master data stored in the solder material test apparatus according to the embodiment of the invention;

FIG. 5 is an explanatory view illustrating a process of reading printing process times T1 and T2 from the master data stored in the solder material test apparatus according to the embodiment of the invention;

FIG. 6 is block diagram illustrating a modified example of the control unit shown in FIG. 1;

FIG. 7 is block diagram illustrating a modified example of the control unit shown in FIG. 1 but being different from the control unit shown in FIG. 6;

FIG. 8 is a flowchart showing processes executed by the control unit shown in FIG. 1 in a test mode;

FIG. 9 is a graph illustrating master data different from the master data shown in FIG. 4; and FIG. 10 is a view illustrating droop of the solder material formed between a squeegee and a mask in a printer.

DESCRIPTION OF THE PREFERRED EMBODIMENTS

Hereinafter, a solder material test apparatus according to an embodiment of the invention will be described with reference to the drawings. The solder material test apparatus according to the embodiment includes a construction for acquiring deterioration degree data that indicates the deterioration degree of a solder material by using infrared rays. The construction can be implemented by applying a technique disclosed in Japanese Patent Application No. 2005-046284. Hereinafter, before the solder material test apparatus according to the embodiment is described, a principle for acquiring the deterioration degree data by using an infrared ray will be described in detail.

Deterioration Degree Data

When a solder material is used and exposed to the air, the metal oxide contained in the solder material increases, and the oxidation degree of the solder material increases, which causes the corresponding solder material to deteriorate. In addition, when a solder material is used and exposed to the air, a carboxylic acid contained in the solder material changes to carboxylate, so that the viscosity of the solder material increases, while reduction power decreases. As a result, the corresponding solder material deteriorates. That is, as the solder material deteriorates, the metal oxide and the carboxylate contained in the solder material increase, and the carboxylic acid contained in the solder material decreases.

The solder material has as a main ingredient a metallic material, such as tin (Sn) or lead (Pb). Tin dioxide or lead dioxide may be used as the metal oxide. In addition, for example, rosin ($C_{19}H_{29}COOH$) may be used as the carboxylic acid contained in the solder material.

It is known that, the metal oxide, the carboxylic acid, and the carboxylate contained in the solder material have a property to absorb infrared rays in a specific wave number band specified in each of them. More specifically, the absorption of an infrared ray at a wave number of about 600 $cm^{-1}$ causes a vibration in an oxygen-metal bond of the metal oxide contained in the solder material. Meanwhile, the absorption of an infrared ray at a wave number of about 1300 $cm^{-1}$ causes a symmetric stretching vibration in the carboxylate contained in the solder material, and the absorption of an infrared ray at a wave number of about 1600 $cm^{-1}$ causes an inverse-symmetric stretching vibration in the carboxylate contained in the solder material. Furthermore, the absorption of an infrared ray at a wave number of about 1700 $cm^{-1}$ causes a stretching vibration in a carbon-oxygen double-bond in the carboxylic acid contained in the solder material.

Accordingly, if the solder material deteriorates, the metal oxide contained in the solder material increases, so that the absorbance of an infrared ray at a wave number of about 600 $cm^{-1}$ increases in the soldering material. In addition, if the solder material deteriorates, the carboxylate contained in the solder material increases, so that the absorbance of infrared rays at wave numbers of about 1300 $cm^{-1}$ and 1600 $cm^{-1}$ increases in the soldering material. Furthermore, if the solder material deteriorates, the carboxylic acid contained in the solder material decreases, so that the absorbance of an infrared ray at a wave number of about 1700 $cm^{-1}$ is lowered in the soldering material.

That is, it can be known that the deterioration degree of the solder material is in direct proportion to the absorbance of infrared rays at wave numbers of about 600 $cm^{-1}$, 1300 $cm^{-1}$ and 1600 $cm^{-1}$ and is inverse proportion to the absorbance of an infrared ray at a wave number of about 1700 $cm^{-1}$. For example, as shown in FIG. 2, when measuring the infrared-ray absorbance of a new solder material and a deteriorated solder material, the infrared-ray absorbance of the deteriorated solder material is higher than the infrared-ray absorbance of the new solder material at around 600 $cm^{-1}$ (reference symbol a), 1300 $cm^{-1}$ (reference symbol b), and 1600 $cm^{-1}$ (reference symbol c). In addition, the infrared-ray absorbance of the deteriorated solder material is lower than the infrared-ray absorbance of the new solder material at around 1700 $cm^{-1}$ (reference symbol d).

Accordingly, it is possible to analyze the deterioration state of the corresponding solder material by measuring the infrared-ray absorbance at a specific wave number (one of the wave numbers of 600 $cm^{-1}$, 1300 $cm^{-1}$, 1600 $cm^{-1}$, and 1700 $cm^{-1}$) and using the measured infrared-ray absorbance as the deterioration degree data (data which indicates the deterioration degree of a solder material). When the infrared-ray absorbance at the wave numbers of about 600 $cm^{-1}$, 1300 $cm^{-1}$, and 1600 $cm^{-1}$ is used as the deterioration degree data, the larger the value of the deterioration degree data becomes, the higher the deterioration degree of the solder material is. The smaller the value of the deterioration degree data becomes, the lower the deterioration degree of the solder material is. When the infrared-ray absorbance at a wave number of 1700 $cm^{-1}$ is used as the deterioration degree data, the larger the value of the deterioration degree data becomes, the lower the deterioration degree of the solder material is. The smaller the value of the deterioration degree data becomes, the higher the deterioration degree of the solder material is.

Furthermore, by radiating an infrared-ray onto the solder material with a predetermined intensity, detecting the intensity of the infrared ray having a specific wave number radiated onto the corresponding solder material and the intensity of the infrared ray having a specific wave number reflected from the corresponding solder material, the infrared-ray absorbance at a specific wave number in the solder material can be calculated by the following Expression 1:

$$A=-\log(B/BL) \quad (1),$$

A: the infrared-ray absorbance of a solder material at a specific wave number,

B: the intensity of an infrared ray having a specific wave number that is reflected from a solder material, and BL: the intensity of an infrared ray having a specific wave number that is radiated onto a solder material (blank value).

In addition, it is possible to continuously radiate infrared rays onto a solder material with a predetermined intensity, to detect the intensity of the infrared ray having a specific wave number that is reflected from the corresponding solder material, and to use the intensity as the deterioration degree data, without calculating the infrared-ray absorbance. That is because the infrared-ray absorbance of the solder material is in inverse proportion to the intensity of the infrared ray reflected from the solder material when the infrared ray is continuously radiated onto the solder material with a predetermined intensity.

When the intensities of the infrared rays having wave numbers of 600 $cm^{-1}$, 1300 $cm^{-1}$, and 1600 $cm^{-1}$ that are reflected from the solder material are used as the deterioration degree data, the lower the deterioration degree of the solder material becomes, the larger the value of the deterioration degree data is. On the other hand, the higher the deterioration degree of the solder material becomes, the smaller the value of the deterioration degree data is. Further, when the intensity of the infrared-ray having a wave number of 1700 $cm^{-1}$ that is reflected from the solder material is used as the deterioration degree data, the lower the deterioration degree of the solder material becomes, the smaller the value of the deterioration degree data is. On the other hand, the higher the deterioration degree of the solder material becomes, the larger the value of the deterioration degree data is.

Overall Construction of Solder Material Test Apparatus

Next, the construction of the solder material test apparatus according to this embodiment will be described with reference to FIG. 3. FIG. 3 is a block diagram illustrating the schematic construction of the solder material test apparatus according to this embodiment.

As shown in FIG. 3, a solder material test apparatus 100 tests in an in-line manner a solder material which is used by a printer 200 included in a printer board manufacturing line. The printer 200 prints the solder material on a board. The solder material on a surface of a metal mask arranged on the board is pressed and rotatably moved by a squeegee. Furthermore, the solder material is squeezed out of openings of the metal mask onto the board by the pressing force of the squeegee. In this way, the solder material is printed to the board.

As shown in FIG. 3, the solder material test apparatus 100 includes a light source 10, a band-pass filter 11, a photoelectric converter 12, a control unit 13, a storage unit 14, a display unit 15, and an input unit 16. Further, in FIG. 3, the printer 200 is shown in addition to the solder material test apparatus 100. The printer 200 includes a board 21 to be printed, a metal mask 22 arranged on the board 21, a solder material 23 arranged on the metal mask 22, and a squeegee 24 which moves the solder material 23 rotatably by pressing the solder material 23.

The light source 10 is a lamp that can continuously emit light having uniform intensity to the arrangement position of the solder material 23 on the metal mask 22. For example, a ceramic light source may be used as the light source 10.

The band-pass filter 11 is an optical filter arranged on the optical path of the light emitted from the light source 10. The band-pass filter 11 transmits only an infrared ray having a specific wave number. The specific wave number may be one of the wave numbers of $600\,cm^{-1}$, $1300\,cm^{-1}$, $1600\,cm^{-1}$, and $1700\,cm^{-1}$. In this embodiment, a wave number of $1700\,cm^{1}$ is used.

That is, the light source 10 emits an infrared ray having a wave number of $1700\,cm^{-1}$ to the solder material 23 through the band-pass filter 11. Accordingly, the infrared ray having a wave number of $1700\,cm^{-1}$ is reflected from the solder material 23.

The photoelectric converter 12 is arranged at a position on an optical axis of an infrared ray reflected from the solder material 23. The photoelectric converter 12 receives the incident infrared ray reflected from the solder material 23 and converts the incident infrared ray to an analog signal. The photoelectric converter 12 may be a device using, for example, MCT (photoconductor, HgCdTe).

The analog signal converted by the photoelectric converter 12 is transmitted to an A/D converter (not shown), and the A/D converter converts the analog signal into a digital signal and transmits the digital signal to the control unit 13. The digital signal is data which indicates the intensity of the infrared ray emitted to the photoelectric converter 12, that is, the intensity of the infrared ray reflected from the solder material 23.

The control unit 13 integrally controls the operation of the solder material test apparatus 100 and processes the digital signal. The control unit 13 is composed of a computer based on, for example, a PC (personal computer). Further, the computer controls the operation by performing a control program. The computer may read the program recorded in a removal medium, such as a CD-ROM (compact disk read only memory), or it may read the program installed in a hard disk. Further, the program may be downloaded through an external I/F (not shown) and may be installed in, for example, a hard disk. Each block of the control unit 13 will be described in detail below.

The storage unit 14 may be composed of a nonvolatile storage device, such as the above-described hard disk. The above-described control program, an OS (operating system) program, other programs, and data prepared and processed by the control unit 13 may be stored in the storage unit 14.

The display unit 15 may be composed of a display device, such as a CRT (cathode ray tube), an LCD (liquid crystal device), a PDP (plasma display panel), an organic EL (electroluminescence) display, and an inorganic EL display. The display unit 15 displays and outputs various information items, such as a character and an image, on the basis of display data received from the control unit 13.

The input unit 16 receives various information items input to the solder material test apparatus 100 by an operator (user), and it may be composed of an input button, a keyboard, a pointing device, such as a mouse, and other input devices. The input unit 16 converts information input from the operator into input data and transmits the converted input data to the control unit 13.

Next, the control unit 13 will be described in detail with reference to FIG. 1. FIG. 1 is a functional block diagram illustrating the detailed construction of the control unit 13. As shown in FIG. 1, the control unit 13 includes a deterioration degree data acquiring unit 31, a master data preparing unit 32, a reading unit 33, an operating unit 34, and a display control unit 35.

The control unit 13 functions in a learning mode and a test mode and executes a process in one of the modes in response to an instruction input to the input unit 16 by the user. The learning mode creates master data (see FIG. 4) which indicates the relationship between a printing process time and deterioration degree data indicating the deterioration degree of the solder material 23 when a printing process is performed by using the solder material 23 in the printer 200, and stores the master data in the storage unit 14. The learning mode is executed by the deterioration degree data acquiring unit 31, the master data preparing unit 32, and a display control unit 35. In addition, the test mode tests an available remaining time of the solder material 23 to be tested (hereinafter, referred to as a 'test-sample solder material'). The test mode is executed by the deterioration degree data acquiring unit 31, the reading unit 33, the operating unit 34, and a display control unit 35. Further, the above-described 'available remaining time' will be described below in detail.

Learning Mode

Hereinafter, the learning mode will be described. First, the user places into the printer 200 a solder material (hereinafter, referred to as a 'test-sample solder material') 23 which is experimentally used to prepare the master data, and starts a printing process by using the printer 200. Then, the user inputs an instruction for starting the learning mode through the input unit 16. The control unit 13 which receives the instruction for starting the learning mode changes to the learning mode, and then blocks of the deterioration degree data acquiring unit 31, the master data preparing unit 32, and the display control unit 35 execute the following process.

In the learning mode, the deterioration degree data acquiring unit 31 continuously acquires deterioration degree data which indicates the deterioration degree of the test-sample solder material (second solder material) 23 and transmits the deterioration degree data to the master data preparing unit 32. More specifically, the deterioration degree data acquiring unit 31 detects the intensity of an infrared-ray incident on the photoelectric converter 12 (that is, the intensity of an infrared ray having a wave number of about $1700\,cm^{-1}$ that is reflected from the test-sample solder material 23), on the basis of the digital signal transmitted from the photoelectric converter 12 through the A/D converter (not shown), and transmits the detected intensity as the deterioration degree data to the master data preparing unit 32.

Since the deterioration degree data acquired by the deterioration degree data acquiring unit 31 has the intensity of the infrared ray having a wave number of 1700 cm$^{-1}$ that is reflected from the test-sample solder material 23, the larger the value of the deterioration degree data becomes, the higher the deterioration degree of the test-sample solder material 23 is. On the other hand, the smaller the value of the deterioration degree data becomes, the lower the deterioration degree of the test-sample solder material 23 is.

In the learning mode, the master data preparing unit 32 prepares master data (association data) in which a printing process time when a printing process is performed by using the test-sample solder material 23 in the printer 200 is associated with the deterioration degree data of the test-sample solder material 23 during the time when the solder material 23 is used, on the basis of the deterioration degree data transmitted from the deterioration degree data acquiring unit 31, and then stores the master data in the storage unit 14.

The printing process time may mean a time when the printer 200 is continuously driven, it may be the sum of actual printing process times of the printer 200 which is being continuously driven, or it may be the sum of the travel time of the squeegee 24 of the printer 200 which is being continuously driven.

A graph shown in FIG. 4 illustrates an example of the master data. In FIG. 4, a horizontal axis indicates the printing process time, and a vertical axis indicates the deterioration degree data. That is, when the printing process is executed by using the test-sample solder material 23, the printing process time from when the use of the test-sample solder material 23 is started and the deterioration degree data of the test-sample solder material 23 are continuously acquired, and then the correspondence between the printing process time and the deterioration degree data are continuously recorded, thereby obtaining the master data.

In the learning mode, the display control unit 35 reads the master data stored in the storage unit 14 by the master data preparing unit 32 and displays the master data on the display unit 15 in real time. That is, in the learning mode, since the master data being prepared is displayed on the display unit 15, the user can check the master data being prepared in real time.

Next, the flow of the processes in the learning mode will be described below. First, the user places the test-sample solder material 23 on the printer 200 and starts a printing process. Then, the user inputs a learning mode starting instruction through the input unit 16. Therefore, the control unit 13 changes to the learning mode. The deterioration degree data acquiring unit 31 starts to acquire the deterioration degree data of the test-sample solder material 23 which is placed on the printer 200 and continuously transmits the acquired deterioration degree data to the master data preparing unit 32. The master data preparing unit 32 measures the time elapsed from when the learning mode starts, and stores in the storage unit 14 the master data (graph) in which the printing process time is associated with the transmitted deterioration degree data, using the elapsed time as the printing process time (see FIG. 4). The master data being prepared is displayed on the display unit 15 in real time. In addition, as shown in FIG. 4, if the printing process is continuously performed in the printer 200, the test-sample solder material 23 which is placed on the printer 200 starts to deteriorate. When the user checks that the value of the deterioration degree data of the test-sample solder material 23 at that time reaches a limit value through the display unit 15, the user inputs a learning mode terminating instruction through the input unit 16. Then, the control unit 13 terminates the learning mode, and the master data preparing unit 32 terminates to prepare the master data and records on the master data the value of the deterioration degree data at a point of time when the learning mode terminating instruction is input as the limit value. Thus, the master data shown in FIG. 4 is prepared and stored in the storage unit 14.

The limit value (desired value) is a value of the deterioration degree data (for example, a value of the deterioration degree data corresponding to the limit value of the viscosity of the solder material) indicating that the durability of the solder material reaches a limit. The limit value is appropriately set and selected by a user.

In addition, according to the above-described learning mode, the user checks the value of the deterioration degree data and then inputs the learning mode terminating instruction. However, the user may input the learning mode terminating instruction to the control unit 13 at a point of time when the user checks the test-sample solder material 23 which is placed on the printer 200 with eyes and determines that the durability of the test-sample solder material 23 reaches the limit with eyes. In this method, the master data preparing unit 32 also records the value of the deterioration degree data at a point of time when the learning mode terminating instruction is input on the master data as the limit value.

Test Mode

Next, the test mode will be described. First, the user places a test-sample solder material (first solder material) 23 in the printer 200 and starts a printing process by using the printer 200. Then, the user inputs a test instruction through the input unit 16 at an arbitrary point of time. Then, the control unit 13 changes to the test mode such that blocks of the deterioration degree data acquiring unit 31, the reading unit 33, the operating unit 34, and the display control unit 35 execute the following processes.

When the user inputs a test instruction to the control unit 13 through the input unit 16, the deterioration degree data acquiring unit (deterioration degree data acquiring means) 31 acquires deterioration degree data which indicates the deterioration degree of the test-sample solder material 23 at a point of time when the test instruction is input, and transmits the deterioration degree data to the reading unit 33. Further, the deterioration degree data acquiring unit 31 detects the intensity of the infrared ray incident on the photoelectric converter 12 (that is, the intensity of the infrared ray having a wave number of 1700 cm$^{-1}$ that is reflected from the test-sample solder material 23 placed in the printer 200), on the basis of the digital signal transmitted from the photoelectric converter 12 through the A/D converter (not shown), and uses the detected intensity as the deterioration degree data.

Hereinafter, in the test mode, the value of the deterioration degree data of the test-sample solder material 23 acquired by the deterioration degree data acquiring unit 31 is referred to as a test value 'a'.

In the test mode, when the deterioration degree data is transmitted from the deterioration degree data acquiring unit 31, the reading unit (reading means) 33 reads a printing process time T1 associated with the deterioration degree data and a printing process time T2 associated with the limit value from the master data stored in the storage unit 14, and transmits the read printing process times T1 and T2 to the operating unit 34.

That is, as shown in FIG. 5, the printing process time T1 corresponding to the deterioration degree data having the same value as the test value 'a' and the printing process time T2 corresponding to the limit value are searched, and the searched printing process times T1 and T2 are read from the master data.

When the printing process times T1 and T2 are transmitted from the reading unit 33, the operating unit (information creating means) 34 is a block which calculates an available remaining time (time difference) TR according to the following Expression 2 and transmits the available remaining time TR to the display control unit 35:

Available remaining time $TR$=printing process time $T2$−printing process time $T1$ (2).

When the available remaining time TR is transmitted from the operating unit 34, the display control unit (notifying means) 35 controls the display unit 15 to display the available remaining time TR.

As shown in the master data of FIG. 5, when the test-sample solder material 23 is continuously used in the printer 200, the difference between the printing process time T1 and the printing process time T2 corresponds to a time required until the value of the deterioration degree data reaches the limit value from the test value 'a'. In a case in which the test-sample solder material 23 which indicates the deterioration degree data having the test value 'a' is continuously used in the printer 200, if the available remaining time TR that is the difference between the printing process time T2 and the printing process time T1 has elapsed, it is possible to estimate that the deterioration degree data of the test-sample solder material 23 is approximate to the limit value. That is, the available remaining time TR may be considered as information which indicates a time required until the deterioration degree data of the test-sample solder material 23 reaches the limit value when the printing process is performed by using the test-sample solder material 23 in the printer 200.

In a case in which the printing process is continuously performed on the test-sample solder material 23 which is currently placed in the printer 200, if the operator checks the available remaining time TR displayed on the display unit 15, it is possible to estimate the time required until the deterioration degree data of the test-sample solder material 23 reaches the limit value.

Next, the flow of the processes of the control unit 13 in the test mode will be described with reference to a flowchart shown in FIG. 8.

First, the user places the test-sample solder material 23 in the printer 200 and starts a printing process by using the printer 200. Then, the user inputs a test instruction to the control unit 13 through the input unit 16 at an arbitrary point of time. In this way, the control unit 13 changes to the test mode.

When the deterioration degree data acquiring unit 31 detects the input of the test instruction, the deterioration degree data acquiring unit 31 acquires the deterioration degree data which indicates the deterioration degree of the test-sample solder material 23 (S1). Here, the value of the acquired deterioration degree data is the test value 'a'.

The reading unit 33 receives deterioration degree data corresponding to the test value 'a' acquired by the deterioration degree data acquiring unit 31 and reads the printing process time T1 associated with the deterioration degree data corresponding to the test value 'a' and the printing process time T2 associated with the limit value from the master data stored in the storage unit 14 (S2). Next, the operating unit 34 receives the printing process times T1 and T2 read by the reading unit 33 and calculates the available remaining time TR on the basis of the printing process times T1 and T2 (S3). In addition, the display control unit 35 receives the available remaining time TR calculated by the operating unit 34 and displays the available remaining time TR on the display unit 15 (S4). In this way, the operator of the solder material test apparatus 100 can check the available remaining time TR of the test-sample solder material 23 through the display unit 15.

According to the above-described solder material test apparatus 100, when the test-sample solder material 23 which indicates the deterioration degree data corresponding to the test value 'a' is used in the printer 200, the available remaining time TR notified to the operator through the display unit 15 can be considered as a time required until the deterioration degree data of the test-sample solder material 23 reaches the limit value from the test value 'a' (see FIG. 5). When the test-sample solder material 23 is used in the printer 200, the operator can estimate timing when the deterioration degree data of the test-sample solder material 23 reaches the limit value beforehand. Accordingly, the operator can further reduce labor and time, as compared with the related art in which the deterioration degree of the solder material should be frequently measured to grasp the timing.

Further, according to the above-described solder material test apparatus 100, it is possible to estimate the printing process time required until the deterioration degree data of the test-sample solder material 23 reaches the limit value from the test value 'a' without using a keeping time and an usage history of the test-sample solder material 23. Accordingly, the labor and time required to record the keeping time and the usage history can be reduced.

The invention is not limited to the above-described embodiment, but can be modified in various ways within the scope set forth in the claims. The embodiments obtained by properly combining the technical means disclosed in the above-described embodiment are included in the technical scope of the invention.

For example, the above-described operating unit 34 calculates the available remaining time TR by using the Expression 2. However, if the available remaining time TR is the value which indicates the difference between the printing process time T1 and the printing process time T2, the operator can estimate an operating time required until the deterioration degree of the solder material reaches the limit value. Therefore, the available remaining time TR is not limited to the value calculated by Expression 2.

For example, the available remaining time TR may be calculated by the following Expressions 3 and 4:

Available remaining time $TR$=printing process time $T1$−printing process time $T2$ (3), and Available remaining time $TR$=|printing process time $T2$−printing process time $T1$| (4).

In addition, according to the above-described embodiment, the available remaining time TR is notified to the operator through the display unit 15. However, a limit time obtained by the following Expression 5 may be notified to the operator, instead of the available remaining time TR:

Limit time=current time+available remaining time $TR$ (5)

Even though the above-described limit time is notified to the operator, the operator can estimate the timing beforehand when the deterioration degree data of the test-sample solder material 23 reaches the limit value, when the test-sample solder material 23 is used in the printer 200.

When the limit time is informed to the user, the operating unit 36 not only calculates the available remaining time TR but also obtains the limit time by using Expression 5, and transmits the obtained limit time to the display control unit 35. Then, the display control unit 35 controls the display unit 15 to display the transmitted limit time.

Further, the printing process times T1 and T2 read by the reading unit 33 may be informed to the operator instead of notifying the available remaining time TR or the limit time to the operator. That is because, if the user grasps the printing process times T1 and T2 (see FIG. 5), the user can recognize the difference between the printing process times and a time when the difference between the printing process times is added to the current time, even when the printing process times T1 and T2 are informed to the user. That is, when the printer 200 executes the printing process by using the test-sample solder material 23, the printing process times T1 and T2 can be regarded as information which indicates a time required until the deterioration degree data of the test-sample solder material 23 reaches the limit value.

When the printing process times T1 and T2 read by the reading unit 33 are informed to the operator, the operating unit 34 transmits the printing process times T1 and T2 read by the reading unit 33 to the display control unit 35. Then, the display control unit 35 displays the printing process times T1 and T2 on the display unit 15.

Further, in FIG. 4, the highest value of the deterioration degree data of the master data is the limit value. However, the limit value is not limited to the highest value. For example, by appropriately adjusting the limit value according to the instruction of the user input through the input unit 16, the master data shown in FIG. 4 can be changed to the master data shown in FIG. 9.

In the master data shown in FIG. 4, the deterioration degree data exceeding the limit value is not recorded. Therefore, when the deterioration degree data exceeding the limit value is transmitted to the reading unit 33, the reading unit 33 does not read the printing process time T1 associated with the corresponding deterioration degree data, and the operating unit 34 does not calculate the available remaining time TR. When the deterioration degree data of the test-sample solder material 23 exceeds the limit value, the available remaining time TR is not calculated and displayed on the display unit 15. Further, in a case in which the deterioration degree data exceeding the limit value is transmitted to the reading unit 33, if the control unit 13 has a unit for performing an alarm display through the display unit 15, the operator can know that the deterioration degree of the test-sample solder material 23 has already exceeded the limit value.

Further, in the master data shown in FIG. 9, the deterioration degree data exceeding the limit value is recorded. When the deterioration degree data exceeding the limit value is transmitted to the reading unit 33, the reading unit 33 reads the printing process time T1 associated with the corresponding deterioration degree data, and the operating unit 34 calculates the available remaining time TR. Accordingly, there is a disadvantage that the available remaining time TR is displayed on the display unit 15 regardless of whether the deterioration degree data of the test-sample solder material 23 exceeds the limit value. In the case in which the master data shown in FIG. 9 is used, when the deterioration degree data exceeding the limit value is transmitted to the reading unit 33, it is preferable that the control unit 13 be provided with a unit for preventing the available remaining time TR from being operated and for performing an alarm display through the display unit 15. In this case, it is possible to solve the above-described disadvantage, and it is also possible to inform to the operator that the deterioration degree of the test-sample solder material 23 has already exceeded the limit value.

In addition, the above-described master data indicates the relationship between the printing process time when the printer 200 performs the printing process by using the test-sample solder material 23 and the deterioration degree data of the test-sample solder material 23 during the above-described printing process time. However, the master data is not limited to the printing process time. For example, the master data in which the number of printing processes when the printer 200 performs the printing process by using the test-sample solder material 23 is associated with the deterioration degree data of the test-sample solder material 23 within the corresponding number of printing process may be stored in the storage unit 14. In this case, the horizontal axis of the master data shown in FIG. 4 indicates the number of printing processes, not the printing process time. When the deterioration degree data corresponding to the test value 'a' is transmitted from the deterioration degree data acquiring unit 31, the reading unit 33 reads the number of printing processes S1 associated with the deterioration degree data corresponding to the test value 'a' and the number of printing processes S2 associated with the limit value from the master data, and then transmits both the numbers of printing processes S1 and S2 to the operating unit 34. When the numbers of printing processes S1 and S2 are transmitted from reading unit 33, the operating unit 34 calculates a number difference that is the difference between the numbers of printing processes S1 and S2 and transmits the number difference as a remaining printable number to the display control unit 35. Then, the display control unit 35 displays the remaining printable number on the display unit 15. Here, when the test-sample solder material 23 is continuously used in the printer 200, the remaining printable number corresponds to the number of printing processes required until the value of deterioration degree data reaches the limit value from the test value 'a'. In a case in which the test-sample solder material 23 which indicates the deterioration degree data corresponding to the test value 'a' is continuously used in the printer 200, if the printing process is repeatedly performed as many as the remaining printable number, it can be estimated that the deterioration degree of the test-sample solder material 23 becomes close to the limit value. In the case in which the printing process is continued by using the test-sample solder material 23 being currently placed in the printer 200, the operator who checked the remaining printable number can estimate the number of printing processes where the deterioration degree data of the test-sample solder material 23 reaches the limit value.

The above-described number of printing processes indicates the amount of printing performed by the printer. For example, the number of printing processes means (a) the number of printing processes when a printing process of printing a solder material on a board is performed at a time, (b) the number of printing processes when a printing process of printing a solder material on a predetermined number of boards is performed at a time, and (c) the number of printing processes assumed as one process with respect to a process for moving the print squeegee as many as predetermined times.

Further, the number of printing processes in which the number of printing processes from when the printer starts the printing process at the moment is added to the remaining printable number may be informed to the operator instead of informing the remaining printable number to the operator. In this case, the informed number of printing processes is the number of printing processes from when the printer starts the printing process at that time to when the deterioration degree data of the test-sample solder material 23 reaches the above-described desired value. Further, in this case, the operating unit 34 acquires the number of printing processes from when the printer starts the printing process at the moment from the printer 200 and adds the remaining printable number to the acquired number of printing processes.

In addition, the read numbers of printing processes S1 and S2 may be informed to the operator. In this case, the operator can recognize the remaining printable number if the operator grasps the numbers of printing processes S1 and S2.

As shown in the following table 1, the deterioration speed of the solder material changes in accordance with the temperature and humidity around the printer 200 or the printing speed and printing pressure of the printer 200. Here, the printing speed means the travel speed of the solder material 23 on the metal mask 22 or the travel speed of the squeegee 24 which moves the solder material 23. In addition, the printing pressure means the pressing force of the squeegee 24 against the solder material 23.

TABLE 1

|  | high ← deterioration speed → low |
|---|---|
| temperature | high ← → low |
| humidity | high ← → low |
| printing speed | high ← → low |
| printing pressure | high ← → low |

Here, as shown in table 1, the deterioration speed of the solder material used in the printer 200 is in direct proportion to the temperature and humidity around the printer 200. When the printing process is performed by using the test-sample solder material 23 under the conditions where the temperature or humidity around the printer 200 in the test mode is higher than the temperature or humidity around the printer 200 when the master data is prepared, the actual printing process time required until the deterioration degree data of the test-sample solder material 23 reaches the limit value becomes shorter than the available remaining time TR calculated by the operating unit 34. When the printing process is performed by using the test-sample solder material 23 under the conditions where the temperature or humidity around the printer 200 in the test mode is lower than the temperature or humidity around the printer 200 when the master data is prepared, the actual printing process time required until the deterioration degree data of the test-sample solder material 23 reaches the limit value becomes longer than the available remaining time TR calculated by the operating unit 34.

As shown in FIG. 6, the control unit 13 may have a temperature and humidity acquiring unit 50 which acquires the temperature and humidity around the printer 200 from a temperature and humidity measuring device included in the printer 200, and compensating units (first compensating unit and second compensating unit) 36 which compensate for the available remaining time TR calculated by the operating unit 34 and transmit the compensated available remaining time TR to the display control unit 35.

In the construction shown in FIG. 6, in the learning mode, the master data preparing unit 32 associates the temperature and humidity acquired by the temperature and humidity acquiring unit 50 with the master data and stores the associated temperature and humidity in the storage unit 14. In the test mode, the compensating unit 36 inputs the temperature and humidity acquired by the temperature and humidity acquiring unit 50. If the temperature acquired in the test mode is higher than the temperature recorded in the master data, the compensating unit 36 compensates for the available remaining time TR so as to be shortened. If the temperature acquired in the test mode is lower than the temperature recorded in the master data, the compensating unit 36 compensates for the available remaining time TR so as to be lengthened. In addition, if the humidity acquired in the test mode is higher than the humidity recorded in the master data, the compensating unit 36 compensates for the available remaining time TR so as to be shortened. If the humidity acquired in the test mode is lower than the humidity recorded in the master data, the compensating unit 36 compensates for the available remaining time TR so as to be lengthened. Therefore, when the printing process is continuously performed by using the test-sample solder material 23 in the test mode, the available remaining time TR which is lastly output can be close to the actual printing process time required until the deterioration degree data of the test-sample solder material 23 reaches the limit value.

When the master data in which the number of printing processes at the moment when the printer 200 performs the printing process by using the test-sample solder material 23 is associated with the deterioration degree data of test-sample solder material 23 used as many as the number of printing processes is stored in the storage unit 14, the compensating unit 36 performs compensation as follows. If the temperature acquired in the test mode is higher than the temperature recorded in the master data, the compensating unit 36 compensates for the remaining printable number calculated by the operating unit 34 so as to decrease. If the temperature acquired in the test mode is lower than the temperature recorded in the master data, the compensating unit 36 compensates for the remaining printable number so as to increase. In addition, if the humidity acquired in the test mode is higher than the humidity recorded in the master data, the compensating unit 36 compensates for the remaining printable number calculated by the operating unit 34 so as to decrease. If the humidity acquired in the test mode is lower than the humidity recorded in the master data, the compensating unit 36 compensates for the remaining printable number so as to increase. Therefore, when the printing process is continuously performed by using the test-sample solder material 23 in the test mode, the remaining printable number which is lastly output can be close to the actual number of printing processes required until the deterioration degree data of the test-sample solder material 23 reaches the limit value.

As shown in table 1, the deterioration speed of the solder material used in the printer 200 is in direct proportion to the printing speed and the printing pressure of the printer 200. When the printing process is performed by using the test-sample solder material 23 under the conditions where the printing speed and the printing pressure of the printer 200 in the test mode are higher than the printing speed and the printing pressure of the printer 200 when the master data is prepared, the actual printing process time required until the deterioration degree data of the test-sample solder material 23 reaches the limit value becomes shorter than the available remaining time TR calculated by the operating unit 34. When the printing process is performed by using the test-sample solder material 23 under the conditions where the printing speed and the printing pressure of the printer 200 in the test mode are lower than the printing speed and the printing pressure of the printer 200 when the master data is prepared, the actual printing process time required until the deterioration degree data of the test-sample solder material 23 reaches the limit value becomes longer than the available remaining time TR calculated by the operating unit 34.

As shown in FIG. 7, the control unit 13 may have a printing speed and printing pressure acquiring unit 60 which acquires the printing speed and the printing pressure of the printer 200 from a printing speed and printing pressure measuring device included in the printer 200, and have compensating units (third compensating unit and fourth compensating unit) 37 which compensate for the available remaining time TR calculated by the operating unit 34 and transmit the compensated available remaining time TR to the display control unit 35.

In the construction of FIG. 7, in the learning mode, the master data preparing unit 32 associates the printing speed and the printing pressure acquired by the printing speed and printing pressure acquiring unit 60 with the master data and stores the associated printing speed and printing pressure to the storage unit 14. In the test mode, the compensating unit 37 inputs the printing speed and the printing pressure acquired by the printing speed and printing pressure acquiring unit 60. If the printing speed acquired in the test mode is higher than the printing speed recorded in the master data, the compensating unit 37 compensates for the available remaining time TR so as to be shortened. If the printing speed acquired in the test mode is lower than the printing speed recorded in the master data, the compensating unit 37 compensates for the available remaining time TR so as to be lengthened. In addition, if the printing pressure acquired in the test mode is higher than the printing pressure recorded in the master data, the compensating unit 37 compensates for the available remaining time TR so as to be shortened. If the printing pressure acquired in the test mode is lower than the printing pressure recorded in the master data, the compensating unit 37 compensates for the available remaining time TR so as to be lengthened. Therefore, when the printing process is continuously performed by using the test-sample solder material 23 in the test mode, the available remaining time TR which is lastly output can be close to the actual printing process time required until the deterioration degree data of the test-sample solder material 23 reaches the limit value.

When the master data in which the number of printing processes at the moment when the printer 200 performs the printing process by using the test-sample solder material 23 is associated with the deterioration degree data of test-sample solder material 23 used as many as the number of printing processes is stored in the storage unit 14, the compensating unit 37 performs compensation as follows. If the printing speed acquired in the test mode is higher than the printing speed recorded in the master data, the compensating unit 37 compensates for the remaining printable number calculated by the operating unit 34 so as to decrease. If the printing speed acquired in the test mode is lower than the printing speed recorded in the master data, the compensating unit 37 compensates for the remaining printable number so as to increase. In addition, if the printing pressure acquired in the test mode is higher than the printing pressure recorded in the master data, the compensating unit 37 compensates for the remaining printable number so as to decrease. If the printing pressure acquired in the test mode is lower than the printing pressure recorded in the master data, the compensating unit 37 compensates for the remaining printable number so as to increase. Therefore, when the printing process is continuously performed by using the test-sample solder material 23 in the test mode, the remaining printable number which is lastly output can be close to the actual number of printing processes which is required until the deterioration degree data of the test-sample solder material 23 reaches the limit value.

The printing speed and printing pressure acquiring unit 60 shown in FIG. 7 acquires the printing speed and printing pressure actually measured by a measuring device. However, the invention is not limited to the construction in which the value is actually measured. For example, setting values of the printing speed and the printing pressure selected by the operator of the printer 200 may be transmitted to the printing speed and printing pressure acquiring unit 60 from a computer connected to the printer 200. That is, the printing speed and printing pressure acquiring unit 60 acquires the printing speed and the printing pressure as the setting values (control parameters of the printer 200) instead of the printing speed and printing pressure that are actually measured.

Further, in the above-described embodiment, the intensity of the infrared ray having a wave number of 1700 $cm^{-1}$ that is reflected from the solder material 23 is regarded as the deterioration degree data. However, the deterioration degree data may be the intensity of an infrared ray having a specific wave number (one of the wave numbers of 600 $cm^{-1}$, 1300 $cm^{-1}$, 1600 $cm^{-1}$, and 1700 $cm^{-1}$) that is reflected from the solder material 23 or the absorbance of the infrared ray having the specific wave number in the solder material 23.

Further, the specific wave number is not minutely limited to the 600 $cm^{-1}$, 1300 $cm^{-1}$, 1600 $cm^{-1}$, and 1700 $cm^{-1}$, but the wave number may have an effective range. More specifically, the specific wave number may be in a range of 520 $cm^{-1}$ to 700 $cm^{-1}$, a range of 1270 $cm^{-1}$ to 1430 $cm^{-1}$, a range of 1500 $cm^{-1}$ to 1650 $cm^{-1}$, or a range of 1665 $cm^{-1}$ to 1730 $cm^{-1}$, which is disclosed in Japanese Patent Application No. 2005-046284. The absorption peak of the metal oxide (tin dioxide) contained in the solder material can be detected in the range of 520 $cm^{-1}$ to 700 $cm^{-1}$. The absorption peak of the symmetric stretching vibration of the carboxylate can be detected in the range of 1270 $cm^{-1}$ to 1430 $cm^{-1}$. The absorption peak of the inverse-symmetric stretching vibration of carboxylate can be detected in the range of 1500 $cm^{-1}$ to 1650 $cm^{-1}$. The absorption peak of the carbon-oxygen double bond of carboxylic acid can be detected in the range of 1665 $cm^{-1}$ to 1730 $cm^{-1}$.

In addition, the deterioration degree data may be data which indicates the deterioration degree of the solder material 23 and it is not limited to the intensity or the absorbance of the infrared ray. For example, it is possible to regard a 'surface unevenness degree' disclosed in Japanese Patent Application No. 2005-058112 as the deterioration degree data.

Next, the 'surface unevenness degree' will be described below. The surface unevenness degree is a value which indicates the degree of unevenness existing on a surface of the solder material. As the surface of the solder material becomes rough, the surface unevenness degree becomes high. If the solder material deteriorates, the unevenness of the surface of the solder material increases due to the deterioration. Therefore, when the surface unevenness degree becomes high, the deterioration degree of the solder material becomes high. Accordingly, the surface unevenness degree can be used as the deterioration degree of the solder material. Further, the data input to the deterioration degree data acquiring unit 31 in FIG. 1 may be used as the surface unevenness degree, and the deterioration degree data acquiring unit 31 may transmit the surface unevenness degree as the deterioration degree data to the master data preparing unit 32 or the reading unit 33.

Next, a method of measuring the surface unevenness degree will be described. In particular, as shown in FIG. 3, the solder material test apparatus 100 includes a light source which emits light to the surface of the solder material 23, an image capturing unit (for example, CCD or CMOS) which acquires image data for displaying an image on the surface of the solder material 23, and a surface unevenness degree output unit which calculates a standard deviation for the value of brightness of the image data and outputs the standard deviation as the surface unevenness degree to the deterioration degree data acquiring unit 31. As the unevenness on the surface of the solder material 23 increases, a scattering degree in the direction of light reflected from the solder material 23 becomes larger. Accordingly, the value of the brightness of the image largely varies. Therefore, the standard deviation of the value of the brightness of the corresponding image may be used as an index for indicating the surface unevenness degree of the solder material.

In addition, the average of the absolute value of the brightness difference between adjacent pixels of the image may be used as the surface unevenness degree, because the average is the index which indicates a variation in the value of brightness of the image.

As the deterioration degree data, the 'amount of incident light' or the 'intensity of incident light' disclosed in Japanese Patent Application No. 2005-063146 may be used. Hereinafter, the 'amount of incident light' and the 'intensity of incident light' will be described.

As shown in FIG. 10, in a printer 300, if a squeegee 240 is moved in a direction so as to be separated from a metal mask 220, the droop of the solder material may be formed between the squeegee 240 and the metal mask 220. The droop is not formed when a new solder material is used, but is formed as the solder material deteriorates. As the solder material deteriorates, the amount of droop becomes larger. The construction as shown in FIG. 10 includes a light source which emits light between the squeegee 240 and the metal mask 220 and a light receiving unit which measures the amount of incident light that indicates the amount of light passes between the squeegee 240 and the metal mask 220 or measures the intensity of incident light which indicates the intensity of the light. When the solder material deteriorates, the amount of the droop of the solder material between the squeegee 240 and the metal mask 220 becomes greater, and thus the amount of incident light or the intensity of incident light becomes smaller. The amount of incident light or the intensity of incident light may be the deterioration degree data which indicates the deterioration degree of the solder material. Accordingly, the amount of incident light or the intensity of incident light may be input to the deterioration degree data acquiring unit 31. Then, the deterioration degree data acquiring unit 31 may transmit the amount of incident light or the intensity of incident light as the deterioration degree data to the master data preparing unit 32 or the reading unit 33. In this case, the value of the deterioration degree data is in inverse proportion to the deterioration degree of the solder material.

Further, the construction shown in FIG. 10 may include a light source which emits light between the squeegee 240 and the metal mask 220 and a light receiving unit which measures the amount of incident light that indicates the amount of light reflected from the solder material in which the droop is formed between the squeegee 240 and the metal mask 220 or measures the intensity of incident light which indicates the intensity of the light. As the solder material deteriorates, the amount of the droop of the solder material between the squeegee 240 and the metal mask 220 becomes greater, and the amount of incident light or the intensity of incident light becomes greater. The amount of incident light or the intensity of incident light may be used as the deterioration degree data which indicates the deterioration degree of the solder material. Accordingly, the amount of incident light or the intensity of incident light may be input to the deterioration degree data acquiring unit 31, and the deterioration degree data acquiring unit 31 may transmit the amount of incident light or the intensity of incident light as the deterioration degree data to the master data preparing unit 32 or the reading unit 33.

In addition, in the above-described embodiments, various information items (for example, the available remaining time TR) are informed to the operator through the display unit 15. However, the information may be informed to the user in the form of a voice output from a speaker (not shown).

Further, according to the above-described embodiments, the control unit 13 operates the available remaining time TR or the remaining printable number when the user inputs the test instruction. However, the control unit 13 may automatically operate the available remaining time TR or the remaining printable number without the input of the test instruction from the user. For example, in the test mode, the control unit 13 may calculate the available remaining time TR or the remaining printable number every predetermined time. In addition, in the test mode, the control unit 13 may count the number of printing processes of the printer 200 and calculate the available remaining time TR or the remaining printable number whenever a predetermined number of printing processes is performed.

The available remaining time TR or the remaining printable number may be calculated as follows. First, the control unit 13 reads the printing process time T2 with reference to the master data stored in the storage unit 14, and uses the printing process time T2 as a time required until the solder material reaches the limit. Then, the control unit 13 may count the elapsed time from when the printer 200 starts the printing process and calculate the available remaining time TR or the remaining printable number when the elapsed time reaches 50%, 70%, or 90% of the time required until the solder material reaches the limit.

Incidentally, functions of the control unit in the above-described embodiment can be realized by executing the program stored in the storage units such as a ROM (read only memory) or a RAM and controlling each of the peripheral circuits by means of an operation circuit such as a processor. Accordingly, by merely reading a recording medium which stores the program and executing the program by means of a computer having the above-described operation circuit or the peripheral circuits, the various functions and processes of the control unit according to the embodiment can be realized. Meanwhile, by recording the program on a removable recording medium, the various functions and processes can be realized on a desired computer.

Meanwhile, the recording medium may be those based on a tape system such as a magnetic tape or a cassette tape, a disk system including a magnetic disk such as a floppy disk (registered trademark)/hard disk and an optical disk such as a CD-ROM/MO/MD/DVD/CD-R, a card system such as an IC card (including a memory card) and an optical card, or a semiconductor memory system such as a mask ROM, an EPROM, an EEPROM, or a flash ROM.

Furthermore, the solder material test apparatus according to the embodiment may be structured so as to be connected to a communication network and the program may be supplied to the solder material test apparatus through the communication network. The communication network has no particular limitation and may be the Internet, Intranet, Extranet, LAN, ISDN, VAN, CATV communication network, virtual private network, telephone line network, mobile communication network, or satellite communication network. In addition, a transmission media constructing the communication network has no particular limitation, and may be used in wire line such as IEEE1394, USB, power line carrier, cable TV line, telephone line, or ADSL line or used in wireless such as infrared-ray for IrDA or remote controller, Bluetooth (registered trademark), 802.11 communication standard, HDR, mobile phone network, satellite circuit, and Terrestrial Digital Multimedia Broadcasting network. The invention can be implemented in a form of a computer data signal included in the carrier in which the program is implemented through electrical transmission.

The invention is suitable for a solder material test apparatus used in a printing process on a printer board manufacturing line and a method thereof.

What is claimed is:

1. A solder material test apparatus which tests a solder material used in a printer that prints the solder material on a printer board, comprising:
   a deterioration degree data acquiring unit which acquires deterioration degree data that indicates a deterioration degree of a first solder material, deterioration degree data being an intensity of an infrared ray having a particular wave number which is obtained by illuminating light to a solder material and detecting the intensity of the infrared ray having the particular wave number reflected from the solder material;
   a storage unit which stores association data in advance in which a printing process time when a printing process is performed by using a second solder material in the printer is associated with deterioration degree data of the second solder material at the printing process time when the printing process is performed using the second solder material;
   a reading unit which reads a printing process time associated with the deterioration degree data set as a desired value with reference to the association data, and reads a printing process time associated with the deterioration degree data acquired by the deterioration degree data acquiring unit;
   an information creating unit which creates information that indicates a time required until the deterioration degree data of the first solder material reaches the desired value or a time when the deterioration degree data of the first solder material reaches the desired value, when the printing process is performed by using the first solder material in the printer, on the basis of both the printing process times read by the reading unit; and
   an informing unit which notifies the information to a user.

2. The solder material test apparatus according to claim 1, wherein the information creating unit creates as the information a time difference which indicates the difference between the printing process times read by the reading unit.

3. The solder material test apparatus according to claim 2, further comprising:
   a first compensating unit; and
   a temperature acquiring unit which acquires temperature around the printer,
   wherein, in the association data, the temperature at the moment when the deterioration degree data included in the corresponding association data is measured is associated and recorded, and
   the first compensating unit compensates for the time difference created by the information creating unit to become smaller when the temperature acquired by the temperature acquiring unit is higher than the temperature recorded in the association data, and compensates for the time difference created by the information creating unit to become larger when the temperature acquired by the temperature acquiring unit is lower than the temperature recorded in the association data.

4. The solder material test apparatus according to claim 2, further comprising:
   a compensating unit; and
   a humidity acquiring unit which acquires humidity around the printer,
   wherein, in the association data, the humidity at the moment when the deterioration degree data included in the corresponding association data is measured is associated and recorded, and
   the compensating unit compensates for the time difference created by the information creating unit to become smaller when the humidity acquired by the humidity acquiring unit is higher than the humidity recorded in the association data and compensates for the time difference created by the information creating unit to become larger when humidity acquired by the humidity acquiring unit is lower than the humidity recorded in the association data.

5. The solder material test apparatus according to claim 2, further comprising:
   a compensating unit; and
   a printing speed acquiring unit which acquires the printing speed of the printer,
   wherein, in the association data, the printing speed at the moment when the deterioration degree data included in the corresponding association data is measured is associated and recorded, and
   the compensating unit compensates for the time difference created by the information creating unit to become smaller when the printing speed acquired by the printing speed acquiring unit is higher than the printing speed recorded in the association data and compensates for the time difference created by the information creating unit to become larger when the printing speed acquired by the printing speed acquiring unit is lower than the printing speed recorded in the association data.

6. The solder material test apparatus according to claim 2, further comprising:
   a compensating unit; and
   a printing pressure acquiring unit which acquires the printing pressure of the printer,
   wherein, in the association data, the printing pressure at the moment when the deterioration degree data included in the corresponding association data is measured is associated and recorded, and
   the compensating unit compensates for the time difference created by the information creating unit to become smaller when the printing pressure acquired by the printing pressure acquiring unit is higher than the printing pressure recorded in the association data, and compensates for the time difference created by the information creating unit to become larger when the printing pressure acquired by the printing pressure acquiring unit is lower than the printing pressure recorded in the association data.

7. A solder material test apparatus which tests a solder material used in a printer that prints the solder material on a printer board, comprising:
   a deterioration degree data acquiring unit which acquires deterioration degree data that indicates a deterioration degree of a first solder material, deterioration degree data being an intensity of an infrared ray having a particular wave number which is obtained by illuminating light to a solder material and detecting the intensity of the infrared ray having the particular wave number reflected from the solder material;
   a storage unit which stores association data in advance in which the number of printing processes when a printing process is performed by using a second solder material in the printer is associated with deterioration degree data of the second solder material at the number of printing processes when the printing process is performed using the second solder material;

a reading unit which reads the number of printing processes associated with deterioration degree data set as a desired value with reference to the association data, and reads the number of printing processes associated with the deterioration degree data acquired by the deterioration degree data acquiring unit;

an information creating unit which creates information that indicates the number of printing processes in the printer required until the deterioration degree data of the first solder material reaches the desired value or the number of printing processes from when the printer starts the printing process at a time when the deterioration degree data of the first solder material reaches the desired value, when the printing process is performed by using the first solder material in the printer, on the basis of the numbers of printing processes read by the reading unit; and an informing unit which notifies the information to a user.

8. The solder material test apparatus according to claim 7, wherein the information creating unit creates number difference as the information which indicates the difference between the numbers of printing processes read by the reading unit.

9. The solder material test apparatus according to claim 8, further comprising:

a first compensating unit; and a temperature acquiring unit which acquires temperature around the printer, wherein, in the association data, the temperature at the moment when the deterioration degree data included in the corresponding association data is measured is associated and recorded, and the first compensating unit compensates for the number difference created by the information creating unit to become smaller when the temperature acquired by the temperature acquiring unit is higher than the temperature recorded in the association data, and compensates for the number difference created by the information creating unit to become larger when the temperature acquired by the temperature acquiring unit is lower than the temperature recorded in the association data.

10. The solder material test apparatus according to claim 8, further comprising:

a compensating unit; and a humidity acquiring unit which acquires humidity around the printer, wherein, in the association data, the humidity at the moment when the deterioration degree data included in the corresponding association data is measured is associated and recorded, and the compensating unit compensates for the number difference created by the information creating unit to become smaller when the humidity acquired by the humidity acquiring unit is higher than the humidity recorded in the association data, and compensates for the number difference created by the information creating unit to become larger when humidity acquired by the humidity acquiring unit is lower than the humidity recorded in the association data.

11. The solder material test apparatus according to claim 8, further comprising:

a compensating unit; and a printing speed acquiring unit which acquires the printing speed of the printer, wherein, in the association data, the printing speed at the moment when the deterioration degree data included in the corresponding association data is measured is associated and recorded, and the compensating unit compensates for the number difference created by the information creating unit to become smaller when the printing speed acquired by the printing speed acquiring unit is higher than the printing speed recorded in the association data and compensates for the number difference created by the information creating unit to become larger when the printing speed acquired by the printing speed acquiring unit is lower than the printing speed recorded in the association data.

12. The solder material test apparatus according to claim 8, further comprising:

a compensating unit; and a printing pressure acquiring unit which acquires the printing pressure of the printer, wherein, in the association data, the printing pressure at the moment when the deterioration degree data included in the corresponding association data is measured is associated and recorded, and the compensating unit compensates for the number difference created by the information creating unit to become smaller when the printing pressure acquired by the printing pressure acquiring unit is higher than the printing pressure recorded in the association data, and compensates for the number difference created by the information creating unit to become larger when the printing pressure acquired by the printing pressure acquiring unit is lower than the printing pressure recorded in the association data.

13. A method of controlling a solder material test apparatus which tests a solder material used in a printer that prints the solder material on a printer board, the solder material test apparatus including a control unit and a storage unit which stores association data in advance in which a printing process time when a printing process is performed by using a second solder material in the printer is associated with deterioration degree data of the second solder material at the printing process time when the printing process is performed using the second solder material, deterioration degree data being an intensity of an infrared ray having a particular wave number which is obtained by illuminating light to a solder material and detecting the intensity of the infrared ray having the particular wave number reflected from the solder material, the method comprising, by means of the control unit:

acquiring deterioration degree data that indicates a deterioration degree of a first solder material;

reading, by means of a reading unit, a printing process time associated with deterioration degree data set as a desired value with reference to the association data and reading, by means of the reading unit, a printing process time associated with the deterioration degree data acquired in the acquiring of the deterioration degree data;

creating information that indicates a time required until the deterioration degree data of the first solder material reaches the desired value or a time when the deterioration degree data of the first solder material reaches the desired value, when the printing process is performed by using the first solder material in the printer, on the basis of both the printing process times read by the reading unit; and notifying the information to a user.

14. A method of controlling a solder material test apparatus which tests a solder material used in a printer that prints the solder material on a printer board, the solder material test apparatus including a control unit and a storage unit which stores association data in advance in which the number of printing processes when a printing process is performed by using a second solder material in the printer is associated with deterioration degree data of the second solder material at the number of printing processes when the printing process is performed using the second solder material, deterioration degree data being an intensity of an infrared ray having a particular wave number which is obtained by illuminating light to a solder material and detecting the intensity of the infrared ray having the particular wave number reflected from the solder material, the method comprising, by means of the control unit:

acquiring deterioration degree data that indicates a deterioration degree of a first solder material;

reading, by means of a reading unit, the number of printing processes associated with deterioration degree data set as a desired value with reference to the association data and reading, by means of the reading unit, the number of printing processes associated with the deterioration degree data acquired by the deterioration degree data acquiring unit;

creating information that indicates the number of printing processes in the printer required until the deterioration degree data of the first solder material reaches the desired value or the number of printing processes from when the printer starts the printing process at the moment when the deterioration degree data of the first solder material reaches the desired value, when the printing process is performed by using the first solder material in the printer, on the basis of the numbers of printing processes read by the reading unit; and notifying the information to a user.

\* \* \* \* \*